(12) United States Patent
Gao et al.

(10) Patent No.: US 11,430,828 B2
(45) Date of Patent: Aug. 30, 2022

(54) EVENT DRIVEN PIXEL FOR SPATIAL INFORMATION EXTRACTION

(71) Applicant: OMNIVISION TECHNOLOGIES, INC., Santa Clara, CA (US)

(72) Inventors: Zhe Gao, San Jose, CA (US); Ling Fu, Santa Clara, CA (US); Qing Qin, Santa Clara, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 74 days.

(21) Appl. No.: 17/125,619

(22) Filed: Dec. 17, 2020

(65) Prior Publication Data

US 2022/0199671 A1    Jun. 23, 2022

(51) Int. Cl.

| | |
|---|---|
| *H04N 5/351* | (2011.01) |
| *H04N 5/374* | (2011.01) |
| *H04N 5/378* | (2011.01) |
| *H04N 5/262* | (2006.01) |
| *H01L 27/146* | (2006.01) |
| *H04N 5/3745* | (2011.01) |

(52) U.S. Cl.
CPC ....... *H01L 27/14643* (2013.01); *H04N 5/351* (2013.01); *H04N 5/3745* (2013.01)

(58) Field of Classification Search
CPC ...... H04N 5/351; H04N 5/3745; H04N 5/378; H04N 5/2625; H04N 5/37455; H04N 5/0152; H04N 7/188; H01L 27/14643; H01L 27/14614; G01J 1/44; G01J 2001/4466

USPC .......................................... 348/294, 308, 297
See application file for complete search history.

(56) References Cited

U.S. PATENT DOCUMENTS

| | | | |
|---|---|---|---|
| 10,469,776 B2 | 11/2019 | Finateu et al. | |
| 10,715,750 B2* | 7/2020 | Berner | H01L 27/1461 |
| 11,282,878 B2* | 3/2022 | Shukuri | H01L 27/14614 |
| 2010/0182468 A1* | 7/2010 | Posch | H04N 5/335 |
| | | | 348/294 |
| 2016/0265970 A1* | 9/2016 | Suh | G01J 1/46 |
| 2017/0213105 A1* | 7/2017 | Ji | G06K 9/62 |
| 2017/0280079 A1* | 9/2017 | Fu | H04N 5/374 |
| 2021/0127083 A1* | 4/2021 | Finateu | H04N 5/37455 |

(Continued)

FOREIGN PATENT DOCUMENTS

WO    WO 2020/002562 A1    1/2020

*Primary Examiner* — Marly S Camargo
(74) *Attorney, Agent, or Firm* — Perkins Coie LLP

(57) ABSTRACT

An event driven sensor includes an arrangement of photodiodes including an inner portion laterally surrounded by an outer portion. An outer pixel cell circuit is coupled to generate an outer pixel value in response to photocurrent generated by the outer portion. The outer pixel value is a binned signal representative of an average value of brightness of incident light on the arrangement of photodiodes. An inner pixel cell circuit is coupled to the inner portion to generate an inner pixel value in response to photocurrent generated by from the inner portion. An event driven circuit is coupled to the outer pixel cell circuit and the inner pixel cell circuit. The event driven circuit is coupled to generate an output signal responsive to an inner brightness indicated by the inner pixel value relative to an outer brightness indicated by the outer pixel value.

39 Claims, 9 Drawing Sheets

(56) References Cited

U.S. PATENT DOCUMENTS

2021/0195130 A1* 6/2021 Niwa .................... H04N 5/3745
2021/0344867 A1* 11/2021 Gao .................... H04N 5/37457

* cited by examiner

*E.G.*, M=12 OUTER PIXELS; N=4 INNER PIXELS

EVENT DRIVEN PIXEL FOR SPATIAL INFORMATION EXTRACTION

BACKGROUND INFORMATION

Field of the Disclosure

This disclosure relates generally to image sensors, and in particular but not exclusively, relates to image sensors that sense events.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
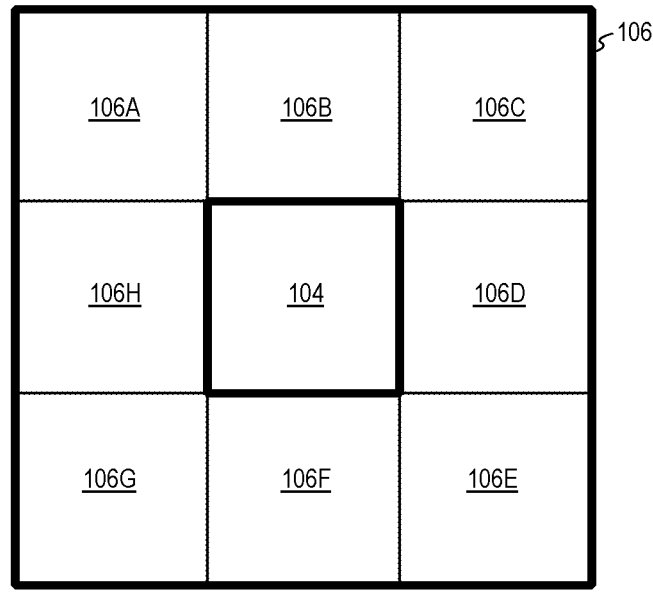
FIG. 1 illustrates one example of an arrangement of photodiodes including an inner portion and an outer portion included in an event driven sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an event driven sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left,"

"right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an event driven sensor including an arrangement of photodiodes having an inner portion laterally surrounded by an outer portion are disclosed. In various examples, the event driven sensor includes an arrangement of photodiodes having an inner portion laterally surrounded by an outer portion coupled to event driven circuitry, which enables examples of the event driven sensor the ability to extract static and/or spatial contrast event information in addition to temporal event information from a scene in accordance with the teachings of the present invention.

To illustrate, FIG. 1 illustrates one example of an arrangement of photodiodes 102 including an inner portion 104 and an outer portion 106 included in an event driven sensor in accordance with the teachings of the present invention. In the various examples, the inner portion 104 includes at least one photodiode and the outer portion 106 includes a plurality of photodiodes, which laterally surround the inner portion 104. For instance, the example depicted in FIG. 1 illustrates an example in which the arrangement of photodiodes 102 is a 3×3 arrangement of photodiodes with the inner portion 104 including one photodiode (104) and the outer portion 106 including eight photodiodes 106A, 106B, 106C, 106D, 106E, 106F, 106G. In one example, the pixel pitch of each photodiode included in the arrangement of photodiodes 102 may be 5.6 μm.

Figure 2:
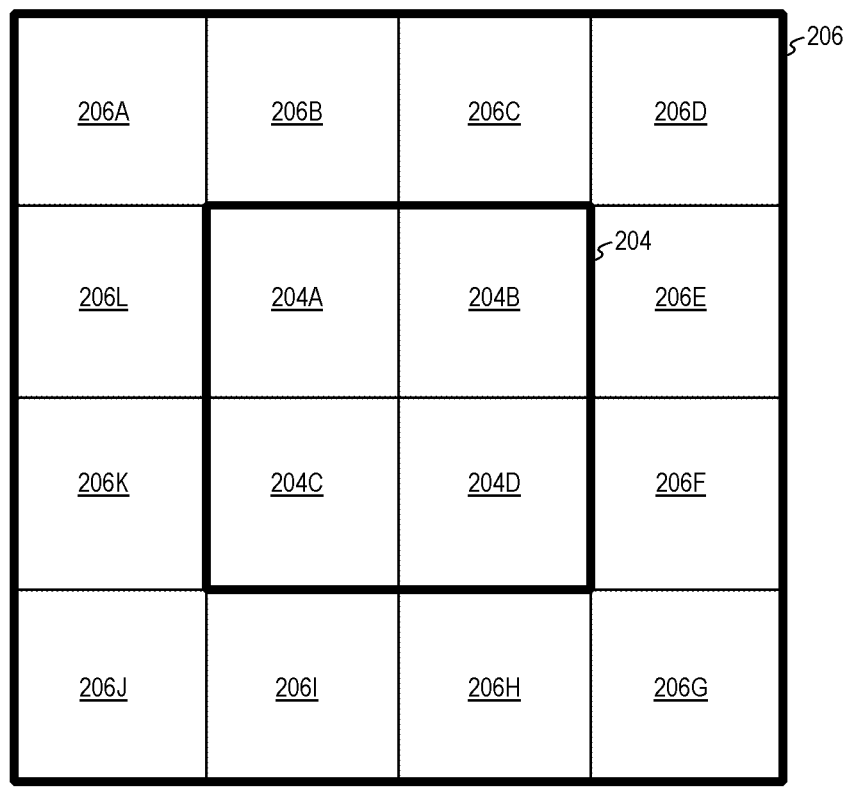
FIG. 2 illustrates another example of an arrangement of photodiodes including an inner portion and an outer portion included in an event driven sensor in accordance with the teachings of the present invention.

FIG. 2 illustrates another example of an arrangement of photodiodes 202 including an inner portion 204 and an outer portion 206 included in an event driven sensor in accordance with the teachings of the present invention. Similar to the example shown in FIG. 1 above, in the example illustrated in FIG. 2, the inner portion 204 includes at least one photodiode and the outer portion 206 includes a plurality of photodiodes, which laterally surround the inner portion 204. For instance, the example depicted in FIG. 2 illustrates an example in which the arrangement of photodiodes 202 is a 4×4 arrangement of photodiodes with the inner portion 204 including a 2×2 arrangement of four photodiodes 204A, 204B, 204C, 204D and the outer portion 206 including twelve photodiodes 206A, 206B, 206C, 206D, 206E, 206F, 206G, 206H, 206I, 206J, 206K, 206L. In one example, the pixel pitch of each photodiode included in the arrangement of photodiodes 202 may be 1.4 μm.

It is appreciated that the examples shown in FIG. 1-2 are provided for explanation purposes and that in other examples, the arrangement of photodiodes 102, 202 including an inner portion 104, 204 laterally surrounded by an outer portion 106, 206 may include combinations having different numbers of photodiodes for the inner portion that is laterally surrounded by the outer portion in the arrangement of photodiodes in accordance with the teachings of the present invention.

With the example arrangements 102, 202 depicted in FIGS. 1-2, spatial contrast information may be extracted from incident light received from a scene by an event driven sensor coupled to the arrangement of photodiodes that is configured to differentiate a bright center or a dark center detected by the inner portion 104, 204 relative to the outer portion 106, 206 in accordance with the teachings of the present invention. In various examples, the spatial contrast event information may be provided by the event driven sensor in addition to time-domain or temporal event information.

Figure 3:
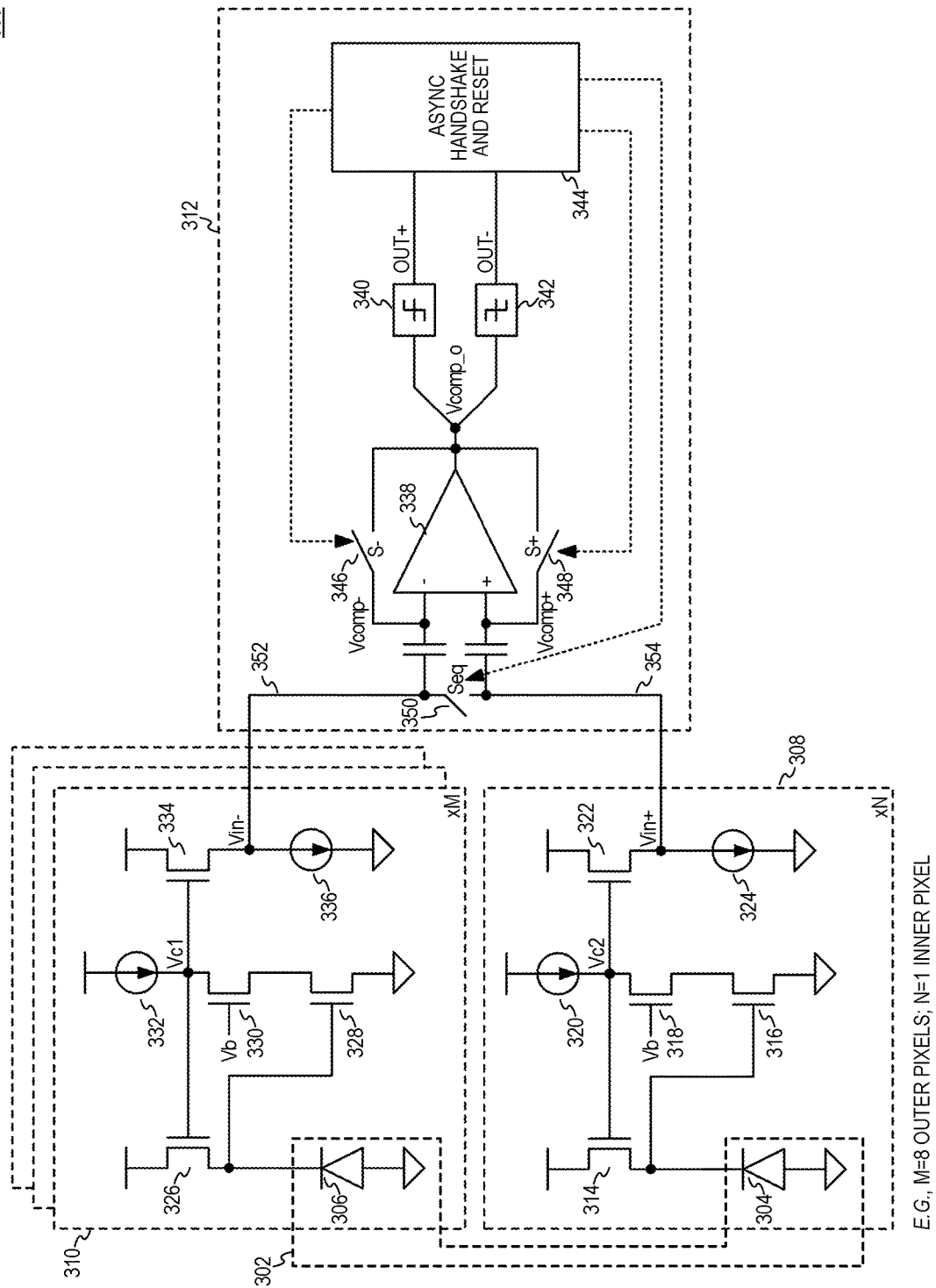
FIG. 3 illustrates one example of a schematic of an arrangement of photodiodes including an inner portion and an outer portion coupled to an event driven circuit of an event driven sensor in accordance with the teachings of the present invention.

FIG. 3 illustrates one example of a schematic an event driven sensor 300 including an arrangement of photodiodes 302 coupled to an event driven circuit 312 in accordance with the teachings of the present invention. It is appreciated that the arrangement of photodiodes 302 included in the event driven sensor 300 of FIG. 3 may be an example of the arrangement of photodiodes 102 of FIG. 1, and that similarly named and numbered elements described above are coupled and function similarly below.

In the example depicted in FIG. 3, event driven sensor 300 includes arrangement of photodiodes 302, which includes an inner portion 304 laterally surrounded by an outer portion 306. In one example, the inner portion 304 includes N photodiodes, which can be one or more photodiodes, and the outer portion 306 includes a plurality of M photodiodes. In the depicted example, M=8 photodiodes and N=1 photodiode. In the example, the arrangement of photodiodes 302 is optically coupled to receive incident light from a scene.

In the example illustrated in FIG. 3, an outer pixel cell circuit 310 includes or is coupled to the outer portion 306 of the arrangement of photodiodes 302. The outer pixel cell circuit 310 is coupled to generate an outer pixel value at an output 352 of the outer pixel cell circuit 310 in response to photocurrent generated by the outer portion 306 of the arrangement of photodiodes 302 in response to the incident light. As shown in the depicted example, the outer pixel cell circuit 310 is one of a plurality of M=8 outer pixel cell circuits such that each one of the plurality of M=8 outer converter circuits includes or is coupled to a respective one of the plurality of M=8 photodiodes of the outer portion 306 of the arrangement of photodiodes 302 to convert the photocurrent generated by the outer portion 306 of the arrangement of photodiodes 302 to an outer voltage. In the example, the outputs of each of the M=8 outer pixel cell circuits are coupled to each other at output 352. In the example, the outer voltage of the outer pixel value at the output 352 is a binned signal representative of an average value of brightness of the incident light from the scene on the outer portion 306 of the arrangement of photodiodes 302.

The example illustrated in FIG. 3 shows that an inner pixel cell circuit 308 includes or is coupled to the inner portion 304 of the arrangement of photodiodes 302. The inner pixel cell circuit 308 is coupled to generate an inner pixel value having an inner voltage at an output 354 of the inner pixel cell circuit 308 in response to photocurrent generated by from the inner portion 304 of the arrangement of photodiodes 302.

In the illustrated example, an event driven circuit 312 is coupled to the outer pixel cell circuit 310 and the inner pixel cell circuit 308 to receive outer pixel value from output 352 and the inner pixel value from output 354. In operation, the event driven circuit 312 is coupled to generate an output signal responsive to an inner brightness indicated by the inner pixel value from inner pixel cell circuit 308 relative to an outer brightness indicated by the outer pixel value from outer pixel cell circuit 310.

In the one example, inner pixel cell circuit 308 includes an inner converter circuit, which is coupled to convert the photocurrent generated by the inner portion 304 of the arrangement of photodiodes 302 to an inner voltage. As such, the inner converter circuit has an input coupled to the inner portion 304 of the arrangement of photodiodes 302 and an output. In the example depicted in FIG. 3, there is N=1 photodiode in inner portion 304, and as such, there is N=1 inner pixel cell circuit 308. In the depicted example, the inner converter circuit includes a first transistor 314, a second transistor 316, a third transistor 318, and a first current source 320.

As shown, the first transistor 314 has a source coupled to the inner portion 304 of the arrangement of photodiodes 302 and a drain coupled to a voltage supply. The second transistor 316 has a gate coupled to the source of the first transistor 314 and the inner portion 304 of the arrangement of photodiodes 302. In the example, the input of the inner converter circuit is coupled to the source of the first transistor 314 and the gate of the second transistor 316. The source of second transistor 316 is coupled to ground. The third transistor 318 has a drain coupled to a gate of the first transistor 314 and the first current source 320. In the example, the output Vc2 of the inner converter circuit is coupled to the drain of the third transistor 318 and the gate of the first transistor 314. The source of the third transistor 318 is coupled to the drain of the second transistor 316. The gate of the third transistor 318 is coupled to a bias voltage Vb.

In the example, an inner voltage buffer circuit is coupled to the output Vc2 of the inner converter circuit to generate the inner pixel value, which is coupled to the output 354 of the inner pixel cell circuit, in response to the photocurrent generated by the inner portion 304 of the arrangement of photodiodes 302. In the depicted example, the inner voltage buffer circuit includes a fourth transistor 322 and a second current source 324. As shown, the fourth transistor 322 has a gate coupled to the drain of the third transistor 318 and the gate of the first transistor 314. The fourth transistor 322 is configured as a source follower with its source coupled to the second current source 324. The source of the fourth transistor 322 is coupled to the output 354 of the inner pixel cell circuit.

In the depicted example, each of the M=8 outer pixel cell circuits 310 includes an outer converter circuit, which is coupled to convert the photocurrent generated by the outer portion 306 of the arrangement of photodiodes 302 to an outer voltage. As such, the outer converter circuit has an input coupled to the outer portion 306 of the arrangement of photodiodes 302 and an output. In the example depicted in FIG. 3, there are M=8 photodiodes in outer portion 306, and as such, there are M=8 outer pixel cell circuits 310. In the depicted example, each outer converter circuit includes a fifth transistor 326, a sixth transistor 328, a seventh transistor 330, and a third current source 332.

As shown, the fifth transistor 326 has a source coupled to the outer portion 306 of the arrangement of photodiodes 302 and a drain coupled to a voltage supply. The sixth transistor 328 has a gate coupled to the source of the fifth transistor 326 and the outer portion 306 of the arrangement of photodiodes 302. In the example, the input of the outer converter circuit is coupled to the source of the fifth transistor 326 and the gate of the sixth transistor 328. The source of sixth transistor 328 is coupled to ground. The seventh transistor 330 has a drain coupled to a gate of the fifth transistor 326 and the third current source 332. In the example, the output Vc1 of the outer converter circuit is coupled to the drain of the seventh transistor 330 and the gate of the fifth transistor 326. The source of the seventh transistor 330 is coupled to the drain of the sixth transistor 328. The gate of the seventh transistor 330 is coupled to a bias voltage Vb.

In the example, an outer voltage buffer circuit is coupled to the output Vc1 of the outer converter circuit to generate the outer pixel value, which is coupled to the output 352 of the outer pixel cell circuit, in response to the photocurrent generated by the outer portion 306 of the arrangement of photodiodes 302. In the depicted example, the outer voltage buffer circuit includes an eighth transistor 334 and a fourth current source 336. As shown, the eighth transistor 334 has a gate coupled to the drain of the seventh transistor 330 and the gate of the fifth transistor 326. The eighth transistor 334 is configured as a source follower with its source coupled to the fourth current source 336. The source of the eighth transistor 334 is coupled to the output 352 of the outer pixel cell circuit.

The example depicted in FIG. 3 shows that the event driven circuit 312 includes a comparator 338 having a first input (e.g., inverting input) capacitively coupled to the output 352 of the outer pixel cell circuit 310 through a first input capacitor to receive the outer pixel value. The comparator 338 also includes a second input (e.g., non-inverting input) capacitively coupled the output 354 of the inner pixel cell circuit 308 through a second input capacitor to receive the inner pixel value. A first auto-zero switch S− 346 is coupled between the first input of the comparator 338 and an output of the comparator 338. A second auto-zero switch S+ 348 is coupled between the second input of the comparator 338 and the output of the comparator 338.

In one example, event driven circuit 312 also includes an equalizing switch Seq 350 coupled between the output 352 of the outer pixel cell circuit 310 and the output 354 of the inner pixel cell circuit 308. As will be discussed in various examples below, the equalizing switch Seq 350 may be turned on during a reset or auto-zero phase of event driven sensor 300 prior to a comparison phase. In other configurations, the equalizing switch Seq 350 may be turned off during both the reset or auto-zero phase as well as during the comparison phase.

In the example, a first threshold detection circuit 340 is coupled to the output of the comparator 338 and a second threshold detection circuit 342 is coupled to the output of the comparator 338. In one example, the output signal of the event driven sensor 300 is responsive to an output OUT+ of the first threshold detection circuit 340 and an output OUT− of the second threshold detection circuit 342. The illustrated example shows a control circuit 344 is coupled to receive the outputs of first and second threshold detection circuits 340 and 342, and control the switching of the first auto-zero switch S− 346, the second auto-zero switch S+ 348, and the equalizing switch Seq 350 to asynchronously control handshaking and reset operations of the event driven sensor 300 in accordance with the teachings of the present invention.

In the example illustrated in FIG. 3, with M=8 outer pixels and N=1 inner pixel, the event driven sensor 300 utilizes source follower (e.g., eighth transistor 334) binning to obtain an average value of the surrounding photodiodes included in outer portion 306. For instance, in the depicted example M=8 and N=1, each of the outer pixels contributes ⅛th of the average value of the outer portion 306 as represented at output 352, while the inner pixel contributes all (1/1) of the average value of the inner portion 304 as represented at output 354. The comparator 338 then compares the average values represented at output 352 and output 354 to provide an output signal at the outputs OUT+ and OUT− of first threshold detector 340 and second threshold detector 342. In the example, the output includes three states that indicate contrast information between the inner portion 304 and outer portion 306: (1) the inner portion 304 and the outer portion 306 are substantially equal or the same, (2) the inner portion 304 is greater (e.g., brighter) than the outer portion 306, or (3) the inner portion 304 is less than (e.g., dimmer) than the outer portion 306.

Figure 4:
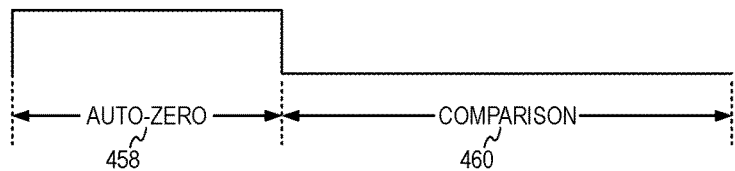
FIG. 4 is one example of a diagram illustrating asynchronous operations of various examples of an arrangement of photodiodes including an inner portion and an outer portion coupled to the event driven circuit of an event driven sensor in accordance with the teachings of the present invention.

FIG. 4 is one example of a diagram 456 illustrating asynchronous operations of various examples of an event driven sensor including an arrangement of photodiodes including an inner portion and an outer portion coupled to the event driven circuit as described for instance in FIG. 3 above in accordance with the teachings of the present invention.

In one example, during an auto-zero phase 458 (e.g., reset phase), the first auto-zero switch S− 346, the second auto-zero switch S+ 348, and the equalizing switch Seq 350, as shown in FIG. 3, are closed or turned on (e.g., "1"). As such, the output of comparator 338 is reset and the outputs 352 and 354 are equalized during the auto-zero phase 458. During this phase, the source follower outputs at output 352 and 354 are short circuited together through equalizing switch Seq 350, which averages the inner portion 304 and outer portion 306 values. In addition, the comparator inputs and out are also auto-zeroed at this average level with auto-zero switches S− 346 and S+ 348 turned on.

During a comparison phase 460, all three switches (first auto-zero switch S− 346, the second auto-zero switch S+ 348, and equalizing switch Seq 350) are then opened or turned off (e.g., "0") to begin the comparison phase 460, which enables the output of comparator 338 to begin continuously providing contrast information between inner portion 304 and outer portion 306 during the comparison phase 460 in response to the incident light received from the scene.

If the scene is static and if the brightness of the incident light on the inner portion 304 is greater than or less than the brightness of the incident light on the outer portion 306, comparator 338 detects this difference in brightness between outputs 352 and 354. In this example, since the comparator 338 was reset or auto-zeroed at the averaged level during the auto-zero phase 458 as discussed above, the comparator 338 will flip accordingly during the comparison phase 460, which will be reflected at the outputs of the first and second threshold detectors 340 and 342. Thus, the event driven sensor 300 is able to detect a static scene event information as well as provide spatial event information regarding the scene in response to the incident light received from the scene in accordance with the teachings of the present invention.

Continuing with the example, if the brightness of the incident light from the scene on the inner portion 304 and the outer portion 306 are at the same level as during the auto-zero phase 458, and if the light from the scene that is incident on inner portion 304 and the outer portion 306 become brighter or darker together during the comparison phase 460 in the time domain, then the comparator 338 will not flip, which would be the case during flickering. As such, the event driven sensor 300 is insensitive to monitor flickering.

If incident light from the scene on the inner portion 304 and the outer portion 306 are at the same level during the auto-zero phase 458, and if inner portion 304 and outer portion 306 incident light brightness changes in opposite directions, then the comparator 338 will flip. Thus, the event driven sensor 300 is also sensitive to temporal changes to provide temporal event information as well. However, the comparator 338 output still also indicates spatial event information, e.g., which part of the arrangement of photodiodes 302 (inner portion 304 or outer portion 306) gets brighter (e.g., on) or darker (e.g., off) in accordance with the teachings of the present invention.

In another example, during the auto-zero phase 458, the equalizing switch Seq 350 may be turned off, while the first auto-zero switch S− 346 and the second auto-zero switch S+ 348 are turned on. In this example, the outputs of the 352 and 354 from the outer portion 306 and inner portion 304 are no longer equalized during the auto-zero phase 458 since the equalizing switch Seq 350 is turned off during the auto-zero phase 458. Thus, the comparator 338 is auto-zeroed during the auto-zero phase 458 at the static scene as indicated with outputs 352 and 354. As such, the event driven sensor 300 loses the ability to detect the static scene during the comparison phase 460 if the equalizing switch Seq 350 is turned off during the auto-zero phase 458. However, it is appreciated that in this configuration with the equalizing switch Seq 350 being turned off during the auto-zero phase 458, mismatch reduction is achieved, which provides improved performance.

Figure 5:
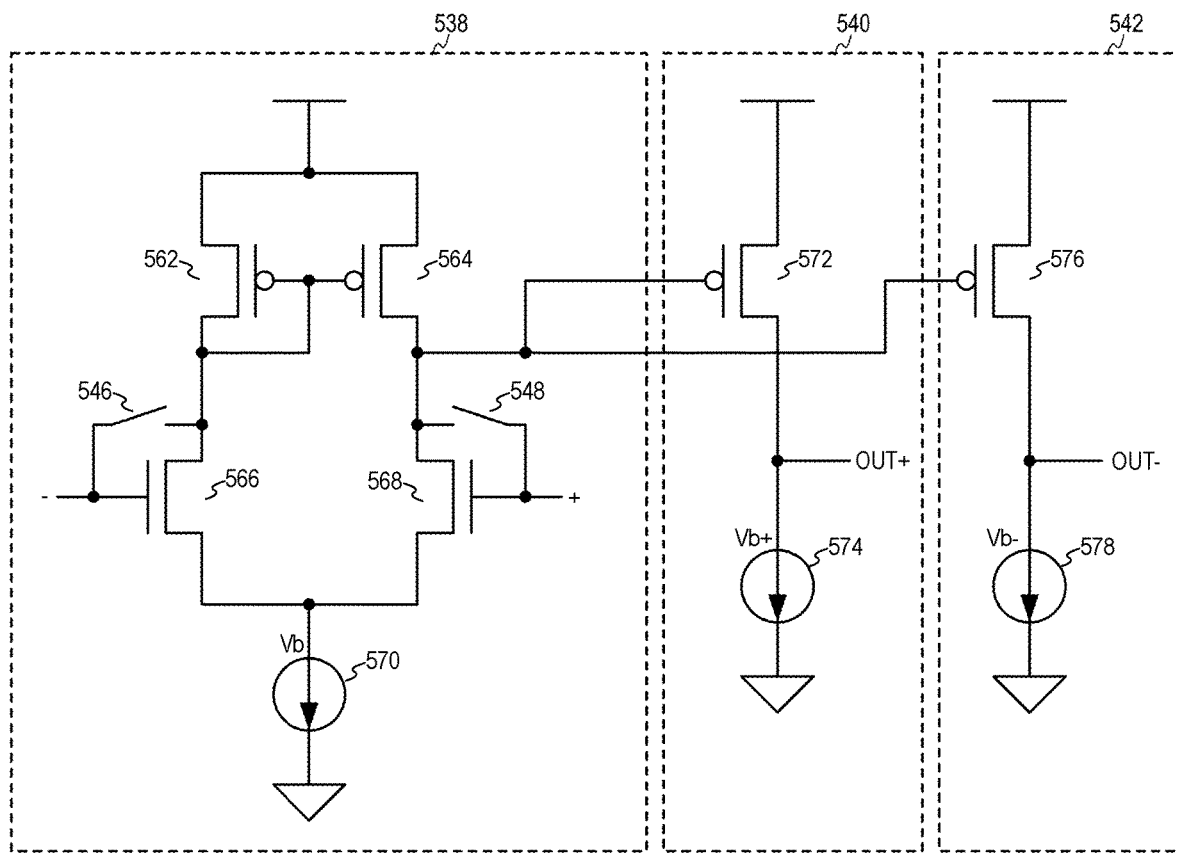
FIG. 5 illustrates one example of a schematic of a comparator coupled to threshold detection circuits included in the event driven circuit of an event driven sensor in accordance with the teachings of the present invention.

FIG. 5 illustrates one example of a schematic of an event driven circuit 512 of an event driven sensor including a comparator coupled to threshold detection circuits in accordance with the teachings of the present invention. It is appreciated that the event driven circuit 512 of FIG. 5 may be an example implementation of the event driven circuit 312 as shown in FIG. 3, and that similarly named and numbered elements described above are coupled and function similarly below. For instance, the example depicted in FIG. 5 shows that event driven circuit 512 includes a comparator 538 coupled to a first threshold detection circuit 540 and a second threshold detection circuit 542.

In one example, comparator 538 includes a current mirror formed with a ninth transistor 562 coupled to a tenth transistor 564. Ninth transistor 562 has a drain coupled to a voltage supply, and tenth transistor 564 has a drain coupled to the voltage supply. A gate of tenth transistor 564 is coupled to a gate and a source of the ninth transistor 562. An eleventh transistor 566 has a drain coupled to the source of the ninth transistor 562. The first input of the comparator 538 (e.g., inverting input) is coupled to a gate of the eleventh transistor 566. A twelfth transistor 568 has a drain coupled to a source of the tenth transistor 564. The second input of the comparator 538 (e.g., non-inverting input) is coupled to a gate of the twelfth transistor 568. In one example, the output of the comparator 538 is coupled to the drain of the twelfth transistor 568. The illustrated example also shows a first tunable current source 570 is coupled to a source of the eleventh transistor 566 and a source of the twelfth transistor 568. In one example, a first auto-zero switch 546 is coupled between the gate and drain of eleventh transistor 566, and a second auto-zero switch 548 is coupled between the gate and drain of twelfth transistor 568.

The illustrated example also shows that the first threshold detection circuit 540 includes a thirteenth transistor 572 having a drain coupled to the voltage supply, a gate coupled to the output of the comparator 538 (e.g., drain of the twelfth transistor 568), and a source coupled to an output (e.g., OUT+) of the first threshold detection circuit 540. In one example, a second tunable current source 574 is coupled to the source of the thirteenth transistor 572 as shown.

The illustrated example further shows that the second threshold detection circuit 542 includes a fourteenth transistor 576 having a drain coupled to the voltage supply, a gate coupled to the output of the comparator 538 (e.g., drain of the twelfth transistor 568), and a source coupled to an output (e.g., OUT−) of the second threshold detection circuit 542. In one example, a third tunable current source 578 is coupled to the source of the fourteenth transistor 576 as shown.

Figure 6:
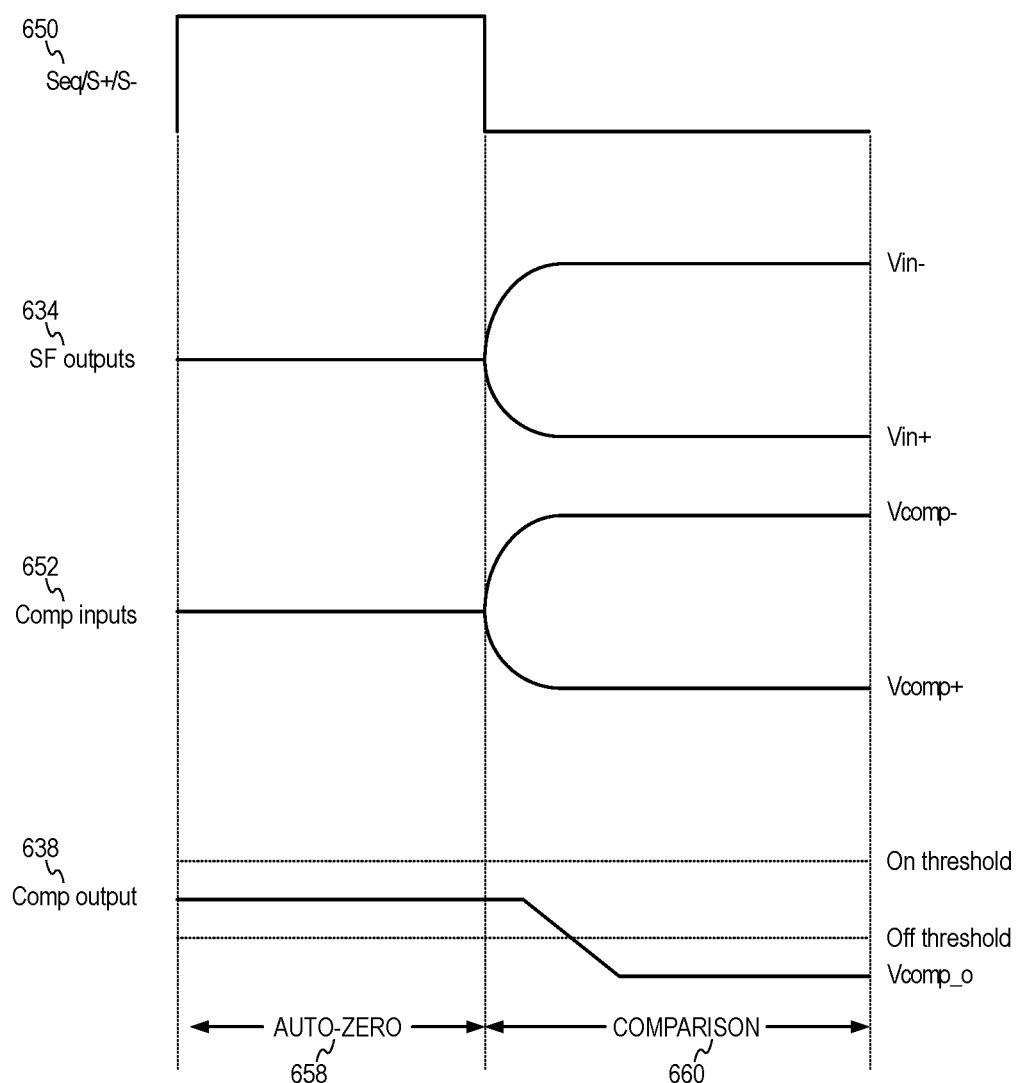
FIG. 6 is another example of a diagram illustrating asynchronous operations of various examples of an arrangement of photodiodes including an inner portion and an outer portion coupled to the event driven circuit of an event driven sensor in accordance with the teachings of the present invention.

In one example, first tunable current source 570, second tunable current source 574, and third tunable current source 578 are configured to provide tunable bias voltages Vb, Vb+, and Vb−, respectively, as shown. In one example, the flipping of the thresholds of the comparator 538 are responsive to the tunable bias voltages Vb, Vb+, and Vb−. As such it is appreciated that the tunable bias voltages Vb, Vb+, and Vb− can be tuned or change to provide different sensitivities and/or threshold levels for event driven circuit 512 in accordance with the teachings of the present invention FIG. 6 is another example of a diagram 680 illustrating asynchronous operations of various examples of an event driven sensor including an arrangement of photodiodes having an inner portion and an outer portion coupled to the event driven circuit as described in FIGS. 3-5 above accordance with the teachings of the present invention.

The illustrated diagram 680 shows Seq/S+/S− 650, which in one example may correspond to equalizing switch 350, first auto-zero switch 346, and second auto-zero switch 348 of FIG. 3. The SF outputs 634 of diagram 680 may correspond to the outputs 352 and 354 of source follower transistors 334 and 322, respectively, of FIG. 3. The comp inputs 652 of diagram 680 may correspond to the inverting and non-inverting inputs of comparator 338 of FIG. 3. The comp output 638 of diagram 680 may correspond to the output of comparator 338 of FIG. 3.

In the depicted example, during the auto-zero phase 658, Seq/S+/S− 650 shows that the equalizing switch 350, first auto-zero switch 346, and second auto-zero switch 348 are closed or turned on. During the comparison phase 660, Seq/S+/S− 650 shows that the equalizing switch 350, first auto-zero switch 346, and second auto-zero switch 348 are opened or turned off. During the auto-zero phase 658, the SF outputs 634 shows that the outputs 352 and 354 of source follower transistors 334 and 322 are averaged to a value, which can be represented by the equation below:

$$SF\ Outputs = \frac{Vc1 + Vc2}{2} - \frac{Vth\_sf1 + Vth\_sf2}{2},$$

where SF Outputs represents the equalized averaged value of outputs 352 and 354, Vc1 and Vc2 represent the voltages at the gates of the source follower transistors 334 and 322, respectively, Vth_sf1 represents the threshold voltage of one of the SF transistors (e.g., transistor 334), and Vth_sf2 represents the threshold voltage of the other one of the SF transistors (e.g., transistor 322). In this example, it is appreciated that during the auto-zero phase 658, the comparator 338 is unable to see the threshold voltage Vth differences since the equalizing switch Seq 350 is turned during the auto-zero phase 658. It is also noted that during the auto-zero phase 658, the comparator output Comp output 638 is auto-zeroed to a value between the On threshold and Off threshold as shown.

Next, during the comparison phase 660, the SF outputs 634 shows that the outputs of the source followers each transition to their respective outputs Vin− and Vin+. For instance, referring to the example depicted in FIG. 3, the output of source follower transistor 334 transitions to Vin− and the output of source follower transistor 322 transitions to Vin+ during the comparison phase 660. In the example, Vin− and Vin+ can be represented with the following equations:

$Vin- = Vc1 - Vth\_sf1,$ $Vin+ = Vc2 - Vth\_sf2.$

Accordingly, with the SF outputs 634 activated during the comparison phase 660, the inputs to the comparator Comp inputs 652 also transition to their respective values Vcomp− and Vcomp+ as shown. With Comp inputs 652 activated during the comparison phase 660, the threshold voltage Vth difference will therefore be reflected in the comparator output Comp output 638. As such, the comparator output Comp output 638 then transitions to the output value Vcomp_o as shown. In the depicted example, Vcomp_o transitions to a value less than the Off threshold in response to the inputs of the comparator 338.

Figure 7:
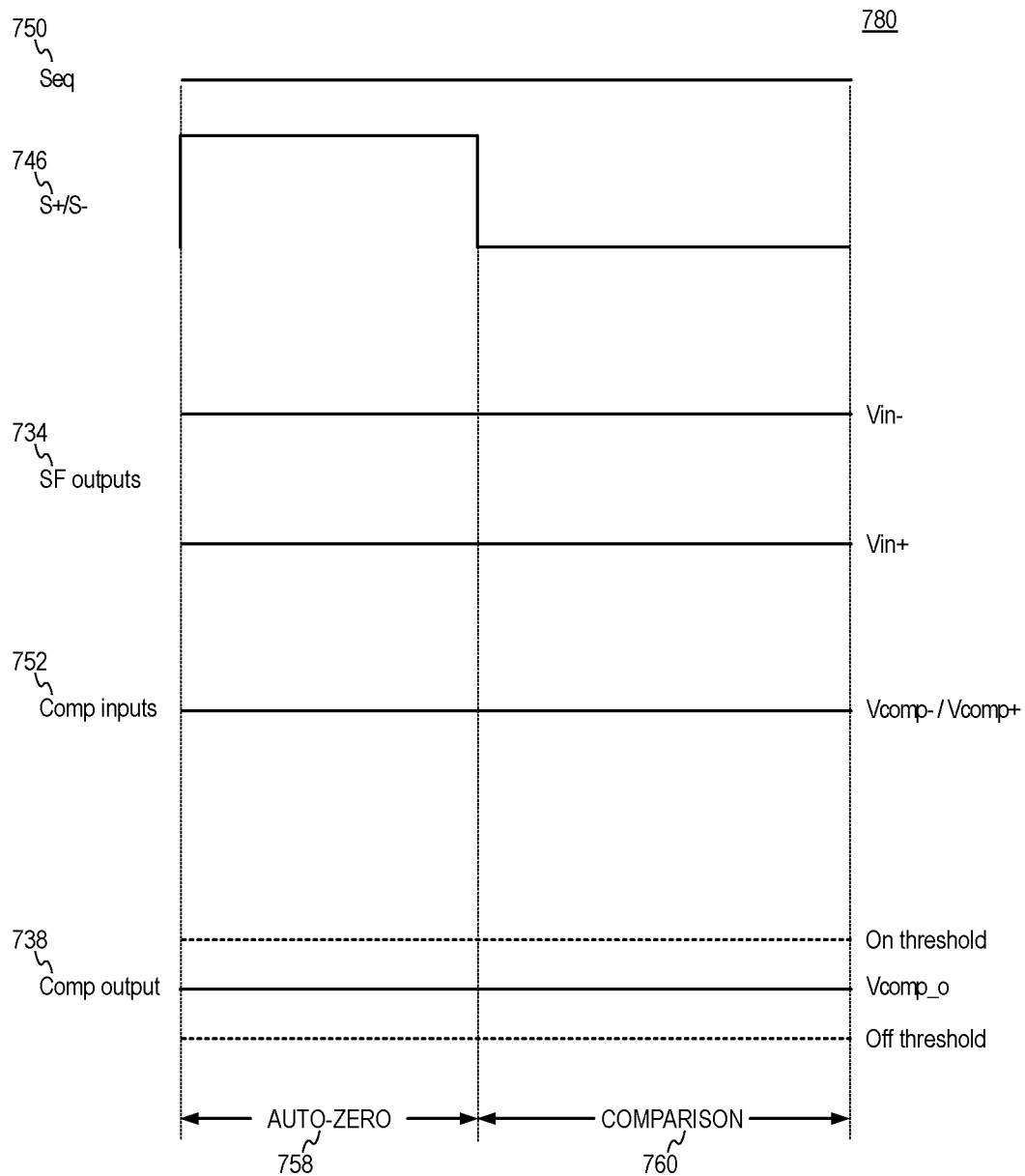
FIG. 7 is yet another example of a diagram illustrating asynchronous operations of various examples of an arrangement of photodiodes including an inner portion and an outer portion coupled to the event driven circuit of an event driven sensor in accordance with the teachings of the present invention.

FIG. 7 is yet another example of a diagram 780 illustrating asynchronous operations of various examples of an event driven sensor including an arrangement of photodiodes having an inner portion and an outer portion coupled to the event driven circuit as described in FIGS. 3-5 above accordance with the teachings of the present invention. It is appreciated that diagram 780 of FIG. 7 shares some similarities with diagram 680 of FIG. 6.

One of the difference between diagram 780 of FIG. 7 and diagram 680 of FIG. 6 is that in diagram 780 of FIG. 7, Seq 750, which represents equalizing switch 350, shows that the equalizing switch 350 remains opened or off during both the auto-zero phase 758 as well as during the comparison phase 760. S+/S− 750, which represents first auto-zero switch 346 and second auto-zero switch 348, shows that first auto-zero switch 346 and second auto-zero switch 348 are closed or on during the auto-zero phase 758, and are opened or turned off during the comparison phase 760.

Similar to FIG. 6, the SF outputs 734 of diagram 780 of FIG. 7 may correspond to the outputs 352 and 354 of source follower transistors 334 and 322, respectively, of FIG. 3. The comp inputs 752 of diagram 780 may correspond to the inverting and non-inverting inputs of comparator 338 of FIG. 3. The comp output 738 of diagram 780 may correspond to the output of comparator 338 of FIG. 3.

In the example depicted in FIG. 7, since the equalizing switch 350 is opened or off during the auto-zero phase 758, the SF outputs are not equalized to an averaged value during the auto-zero phase 758. Instead, the SF outputs 734 reflect the input voltages Vin− and Vin+, respectively, throughout the auto-zero phase 758 as well as the comparison phase 760. As mentioned in the example described in FIG. 6, the Vin− and Vin+ voltages in the example of FIG. 7 can also be represented according to the equations below:

$Vin- = Vc1 - Vth\_sf1,$ $Vin+ = Vc1 - Vth\_sf2.$

Similarly, the Comp inputs 752 reflect their respective Vcomp− and Vcomp+ values throughout the auto-zero phase 758 and the comparison phase 760 as shown. Therefore, during the auto-zero phase 758, the comparator 338 is able to see the threshold voltage Vth differences during the auto-zero phase 758. As such, during the comparison phase 760, the threshold voltage Vth differences will not be reflected in the comparator output Vcomp_o. Accordingly, the Comp output 738 remains at the output voltage Vcomp_0 as shown throughout the auto-zero phase 758 and the comparison phase 760.

Figure 8:
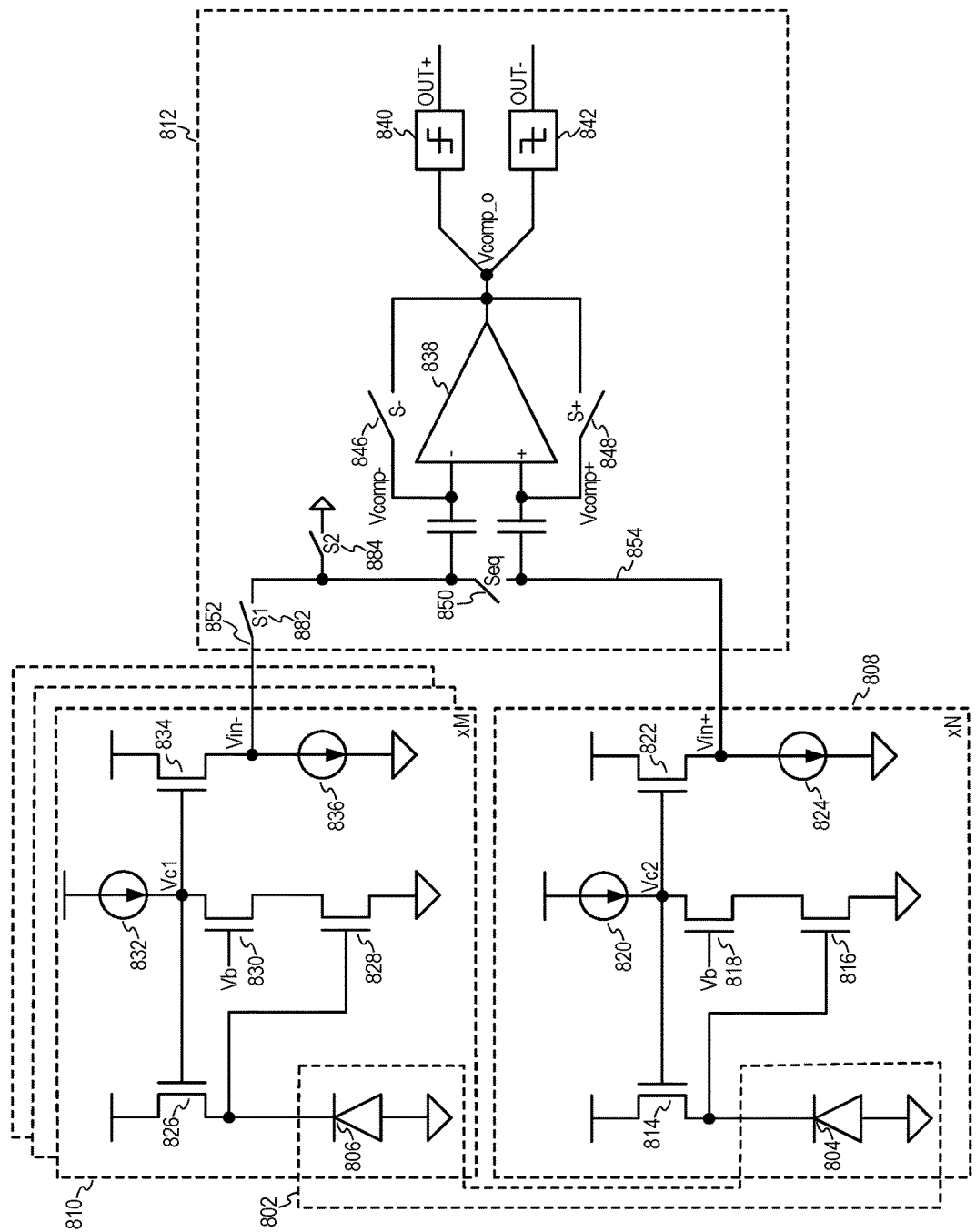
FIG. 8 illustrates another example of a schematic of an arrangement of photodiodes including an inner portion and an outer portion coupled to the event driven circuit of an event driven sensor to extract spatial contrast in accordance with the teachings of the present invention.

FIG. 8 illustrates another example of a schematic an event driven sensor 800 including an arrangement of photodiodes 802 coupled to an event driven circuit 812 in accordance with the teachings of the present invention. It is appreciated that the arrangement of photodiodes 802 included in the event driven sensor 800 of FIG. 8 may be an example of the arrangement of photodiodes 102 of FIG. 1, and that similarly named and numbered elements described above are coupled and function similarly below. It is also appreciated that event driven sensor 800 of FIG. 8 shares many similarities with the example event driven sensor 300 of FIG. 3.

For instance, the example event driven sensor 800 illustrated in FIG. 8 also includes arrangement of photodiodes 802, which includes an inner portion 804 laterally surrounded by an outer portion 806. In one example, the inner portion 804 includes N photodiodes, which can be one or more photodiodes, and the outer portion 806 includes a plurality of M photodiodes. In the depicted example, M=8 photodiodes and N=1 photodiode. In the example, the arrangement of photodiodes 802 is optically coupled to receive incident light from a scene.

In the example illustrated in FIG. 8, an outer pixel cell circuit 810 includes or is coupled to the outer portion 806 of the arrangement of photodiodes 802. The outer pixel cell circuit 810 is coupled to generate an outer pixel value at an output 852 of the outer pixel cell circuit 810 in response to photocurrent generated by the outer portion 806 of the arrangement of photodiodes 802 in response to the incident light. As shown in the depicted example, the outer pixel cell circuit 810 is one of a plurality of M=8 outer pixel cell circuits such that each one of the plurality of M=8 outer converter circuits is coupled to a respective one of the plurality of M=8 photodiodes of the outer portion 806 of the arrangement of photodiodes 802 to convert the photocurrent generated by the outer portion 806 of the arrangement of photodiodes 802 to an outer voltage. In the example, the outputs of each of the M=8 outer pixel cell circuits are coupled to each other at output 852. In the example, the outer voltage of the outer pixel value at the output 852 is a binned signal representative of an average value of brightness of the incident light from the scene on the outer portion 806 of the arrangement of photodiodes 802.

The example illustrated in FIG. 8 also shows that an inner pixel cell circuit 808 includes or is coupled to the inner portion 804 of the arrangement of photodiodes 802. The inner pixel cell circuit 808 is coupled to generate an inner pixel value having an inner voltage at an output 854 of the inner pixel cell circuit 808 in response to photocurrent generated by from the inner portion 804 of the arrangement of photodiodes 802.

In the illustrated example, an event driven circuit 812 is coupled to the outer pixel cell circuit 810 and the inner pixel cell circuit 808 to receive outer pixel value from output 852 and the inner pixel value from output 854. In operation, the event driven circuit 812 is coupled to generate an output signal responsive to an inner brightness indicated by the inner pixel value from inner pixel cell circuit 808 relative to an outer brightness indicated by the outer pixel value from outer pixel cell circuit 810.

In the illustrated example, inner pixel cell circuit 808 includes an inner converter circuit, which is coupled to convert the photocurrent generated by the inner portion 804 of the arrangement of photodiodes 802 to an inner voltage. As such, the inner converter circuit has an input coupled to the inner portion 804 of the arrangement of photodiodes 802 and an output. In the example depicted in FIG. 8, there is N=1 photodiode in inner portion 804, and as such, there is N=1 inner pixel cell circuit 808. In the depicted example, the inner converter circuit includes a first transistor 814, a second transistor 816, a third transistor 818, and a first current source 820.

As shown, the first transistor 814 has a source coupled to the inner portion 804 of the arrangement of photodiodes 802 and a drain coupled to a voltage supply. The second transistor 816 has a gate coupled to the source of the first transistor 814 and the inner portion 804 of the arrangement of photodiodes 802. In the example, the input of the inner converter circuit is coupled to the source of the first transistor 814 and the gate of the second transistor 816. The source of second transistor 816 is coupled to ground. The third transistor 818 has a drain coupled to a gate of the first transistor 814 and the first current source 820. In the example, the output Vc2 of the inner converter circuit is coupled to the drain of the third transistor 818 and the gate of the first transistor 814. The source of the third transistor 818 is coupled to the drain of the second transistor 816. The gate of the third transistor 818 is coupled to a bias voltage Vb.

In the example, an inner voltage buffer circuit is coupled to the output Vc2 of the inner converter circuit to generate the inner pixel value, which is coupled to the output 854 of the inner pixel cell circuit, in response to the photocurrent generated by the inner portion 804 of the arrangement of photodiodes 802. In the depicted example, the inner voltage buffer circuit includes a fourth transistor 822 and a second current source 824. As shown, the fourth transistor 822 has a gate coupled to the drain of the third transistor 818 and the gate of the first transistor 814. The fourth transistor 822 is configured as a source follower with its source coupled to the second current source 824. The source of the fourth transistor 822 is coupled to the output 854 of the inner pixel cell circuit.

In the depicted example, each of the M=8 outer pixel cell circuits 810 includes an outer converter circuit, which is coupled to convert the photocurrent generated by the outer portion 806 of the arrangement of photodiodes 802 to an outer voltage. As such, each outer converter circuit has an input coupled to the outer portion 806 of the arrangement of photodiodes 802 and an output. In the example depicted in FIG. 8, there are M=8 photodiodes in outer portion 806, and as such, there are M=8 outer pixel cell circuits 810. In the depicted example, each outer converter circuit includes a fifth transistor 826, a sixth transistor 828, a seventh transistor 830, and a third current source 832.

As shown, the fifth transistor 826 has a source coupled to the outer portion 806 of the arrangement of photodiodes 802 and a drain coupled to a voltage supply. The sixth transistor 828 has a gate coupled to the source of the fifth transistor 826 and the outer portion 806 of the arrangement of photodiodes 802. In the example, the input of the outer converter circuit is coupled to the source of the fifth transistor 826 and the gate of the sixth transistor 828. The source of sixth transistor 828 is coupled to ground. The seventh transistor 830 has a drain coupled to a gate of the fifth transistor 826 and the third current source 832. In the example, the output Vc1 of the outer converter circuit is coupled to the drain of the seventh transistor 830 and the gate of the fifth transistor 826. The source of the seventh transistor 830 is coupled to the drain of the sixth transistor 828. The gate of the seventh transistor 830 is coupled to a bias voltage Vb.

In the example, an outer voltage buffer circuit is coupled to the output Vc1 of the outer converter circuit to generate the outer pixel value, which is coupled to the output 852 of the outer pixel cell circuit 810, in response to the photocurrent generated by the outer portion 806 of the arrangement of photodiodes 802. In the depicted example, the outer voltage buffer circuit includes an eighth transistor 834 and a fourth current source 836. As shown, the eighth transistor 834 has a gate coupled to the drain of the seventh transistor 830 and the gate of the fifth transistor 826. The eighth transistor 834 is configured as a source follower with its source coupled to the fourth current source 836. The source of the eighth transistor 834 is coupled to the output 852 of the outer pixel cell circuit.

The example depicted in FIG. 8 shows that the event driven circuit 812 includes a comparator 838 having a first input (e.g., inverting input) capacitively coupled to the output 852 of the outer pixel cell circuit 810 through a first input capacitor to receive the outer pixel value. The comparator 838 also includes a second input (e.g., non-inverting input) capacitively coupled the output 854 of the inner pixel cell circuit 808 through a second input capacitor to receive the inner pixel value. A first auto-zero switch S− 846 is coupled between the first input of the comparator 838 and an output of the comparator 838. A second auto-zero switch S+ 848 is coupled between the second input of the comparator 838 and the output of the comparator 838.

In one example, event driven circuit 812 also includes an equalizing switch Seq 850 coupled between the output 852 of the outer pixel cell circuit 810 and the output 854 of the inner pixel cell circuit 808. In various examples, the equalizing switch Seq 850 may be turned on during a reset or auto-zero phase of event driven sensor 800 prior to a comparison phase. In other examples, the equalizing switch Seq 850 may be turned off during both the reset or auto-zero phase as well as during the comparison phase.

In the example, a first threshold detection circuit 840 is coupled to the output of the comparator 838 and a second threshold detection circuit 842 is coupled to the output of the comparator 838. In one example, the output signal of the event driven sensor 800 is responsive to an output OUT+ of the first threshold detection circuit 840 and an output OUT− of the second threshold detection circuit 842.

One of the differences between event driven sensor 800 of FIG. 8 and event driven sensor 300 of FIG. 3 is that event driven sensor 800 of FIG. 8 also includes a switch Si 882 coupled between the output Vin− of the outer pixel cell circuit 810 and the first input capacitor that is coupled to the inverting input of comparator 838. In addition, event driven sensor 800 further includes a switch S2 884 coupled between the first input capacitor that is coupled to the inverting input of comparator 838 and ground as shown.

In operation, the switch Si 882 may be closed or turned on to enable the inverting input of comparator 838 to receive the output Vin− of the outer pixel cell circuit 810. When switch Si 882 is closed or turned on, the switch S2 884 is opened or turned off. The switch Si 882 may be opened or turned off to disable the inverting input of comparator 838 from receiving the output Vin− of the outer pixel cell circuit 810. When switch Si 882 is opened or turned off, the switch S2 884 is closed or turned on so that the inverting input of comparator 838 is enabled to receive a ground signal.

With the flexibility of having the inverting input of comparator 838 able to receive either the output Vin− of the outer pixel cell circuit 810 or a ground signal in response to the setting switch Si 882 and switch S2 884 as described above, the event driven sensor 800 of FIG. 8 can be reconfigured to be temporally sensitive rather than spatially sensitive. For instance, by disabling or turning off the equalizing switch Seq 850 and the switch Si 882 while enabling or turning on the switch S2 884, the comparator 838 can be reconfigured to capture temporal changes only using the inner portion 804 of the arrangement of photodiodes 802 in accordance with the teachings of the present invention.

Figure 9:
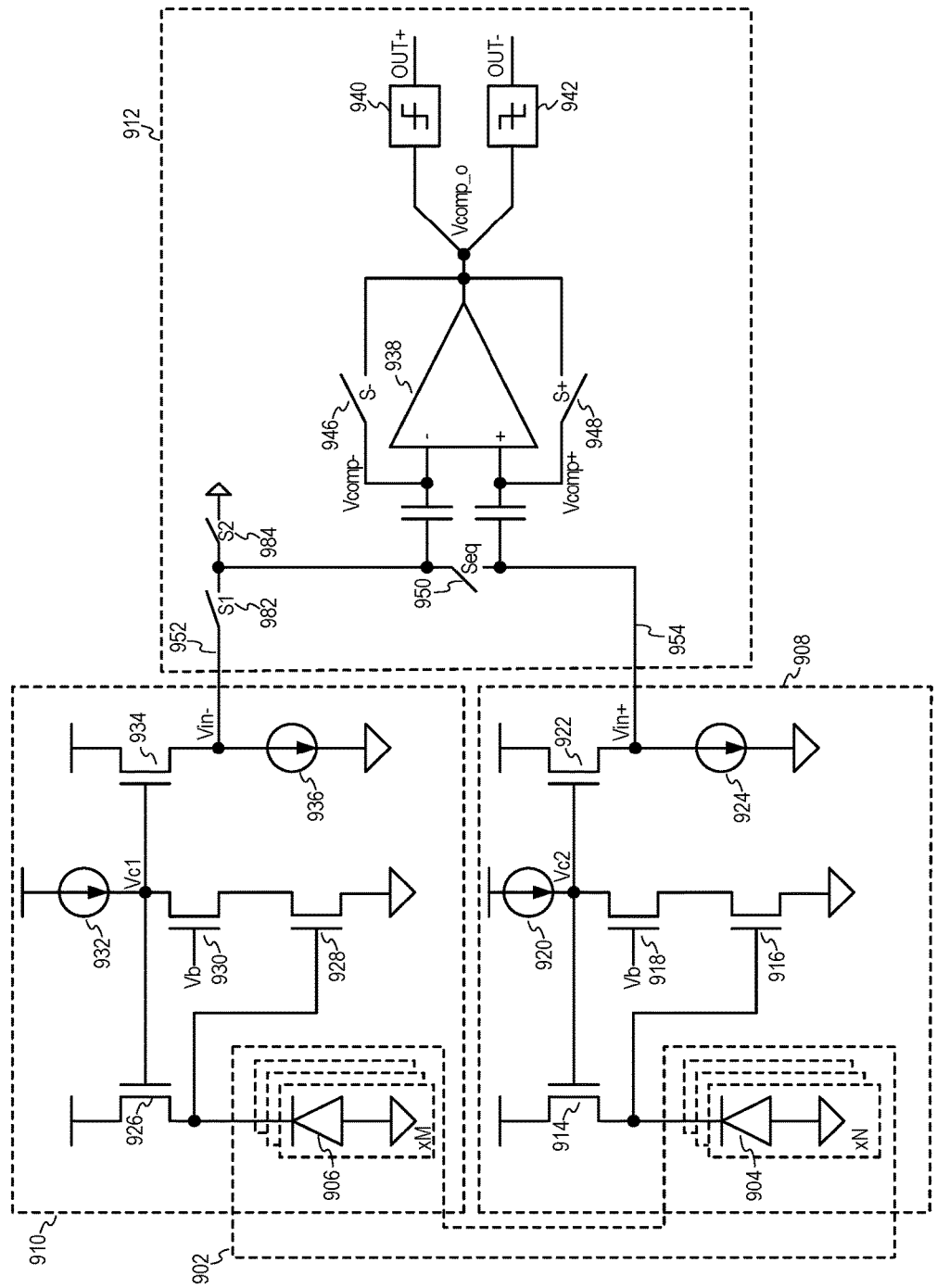
FIG. 9 illustrates yet another example of a schematic of an arrangement of photodiodes including an inner portion and an outer portion coupled to the event driven circuit of an event driven sensor in accordance with the teachings of the present invention.

FIG. 9 illustrates yet another example of a schematic an event driven sensor 900 including an arrangement of photodiodes 902 coupled to an event driven circuit 912 in accordance with the teachings of the present invention. It is appreciated that the arrangement of photodiodes 902 included in the event driven sensor 900 of FIG. 9 may be an example of the arrangement of photodiodes 202 of FIG. 2, and that similarly named and numbered elements described above are coupled and function similarly below. It is also appreciated that event driven sensor 900 of FIG. 9 shares many similarities with the example event driven sensor 800 of FIG. 8.

For instance, the example event driven sensor 900 illustrated in FIG. 9 also includes arrangement of photodiodes 902, which includes an inner portion 904 laterally surrounded by an outer portion 906. In one example, the inner portion 904 includes N photodiodes, which can be one or more photodiodes, and the outer portion 906 includes a plurality of M photodiodes. One of the differences between event driven sensor 900 of FIG. 9 and event driven sensor 800 of FIG. 8 is that in event driven sensor 900 of FIG. 9, M=12 photodiodes and N=4 photodiodes, such as the example depicted in FIG. 2 above. In other examples, it is appreciated the M and N may have different values. In the example, the arrangement of photodiodes 902 is optically coupled to receive incident light from a scene.

Similar to the example event driven sensor 800 of FIG. 8, event driven sensor 900 of FIG. 9 also includes a switch S1 982 coupled between the output Vin− of the outer pixel cell circuit 910 and the first input capacitor that is coupled to the inverting input of comparator 938. In addition, event driven sensor 900 also further includes a switch S2 984 coupled between the first input capacitor that is coupled to the inverting input of comparator 938 and ground as shown.

With the switch Si 982 and switch S2 984, the event driven sensor 900 of FIG. 9 can also be reconfigured to be temporally sensitive or spatially sensitive. For instance, in one example, by disabling or turning off the equalizing switch Seq 950 and the switch Si 982 while enabling or turning on the switch S2 984, the comparator 938 can be configured to capture temporal changes only using the inner portion 904 in accordance with the teachings of the present invention.

In another configuration, by enabling or turning on switch Si 982 and disabling or turning off switch S2 984, and then by turning on equalizing switch Seq 950, first auto-zero switch 946, and second auto-zero switch 948 during the auto-zero phase, and then turning off equalizing switch Seq 950, first auto-zero switch 946, and second auto-zero switch 948 during the comparison phase, the comparator 938 can be configured to detect spatial information from the scene using the inner portion 904 and the outer portion 906. In still another example, it is appreciated that the equalizing switch 950 can be turned off during the auto-zero phase as discussed above to capture spatial-temporal information in accordance with the teachings of the present invention.

Another difference between event driven sensor 900 of FIG. 9 and event driven sensor 800 of FIG. 8 is that the example event driven sensor 900 of FIG. 9 is a more compact solution since only one outer pixel cell circuit 910 is shared among the plurality of M photodiodes included in the outer portion 906 (e.g., M=12 photodiodes), and only one inner pixel cell circuit 908 is shared among the plurality of N photodiodes included in the inner portion 904 (e.g., N=4 photodiodes). In other words, the source follower transistor 934 is shared among the plurality of M photodiodes included in the outer portion 906 and the source follower transistor 922 is shared among the plurality of N photodiodes included in the inner portion 904.

As mentioned, event driven sensor 900 of FIG. 9 otherwise shares many similarities with the example event driven sensor 800 of FIG. 8. For instance, in the example illustrated in FIG. 9, the outer pixel cell circuit 910 includes or is coupled to the plurality of M photodiodes of outer portion 906 of the arrangement of photodiodes 902. The outer pixel cell circuit 910 is coupled to generate an outer pixel value at an output 952 of the outer pixel cell circuit 910 in response to photocurrent generated by the outer portion 906 of the arrangement of photodiodes 902 in response to the incident light. In the example, the output 952 is a binned signal representative of an average value of brightness of the incident light from the scene on the outer portion 906 of the arrangement of photodiodes 902.

The example illustrated in FIG. 9 also shows that the inner pixel cell circuit 908 is coupled to the plurality of N photodiodes of inner portion 904 of the arrangement of photodiodes 902. The inner pixel cell circuit 908 is coupled to generate an inner pixel value having an inner voltage at the output 954 of the inner pixel cell circuit 908 in response to photocurrent generated by from the inner portion 904 of the arrangement of photodiodes 902. In the example, the output 954 is a binned signal representative of an average value of brightness of the incident light from the scene on the inner portion 904 of the arrangement of photodiodes 904.

In the illustrated example, an event driven circuit 912 is coupled to the outer pixel cell circuit 910 and the inner pixel cell circuit 908 to receive outer pixel value from output 952 (when switch Si 982 is turned on and switch S2 984 is turned off as discussed above) and the inner pixel value from output 954. In operation, the event driven circuit 912 is coupled to generate an output signal responsive to an inner brightness indicated by the inner pixel value from inner pixel cell circuit 908 relative to an outer brightness indicated by the outer pixel value from outer pixel cell circuit 910.

In the illustrated example, inner pixel cell circuit 908 includes an inner converter circuit, which is coupled to convert the photocurrent generated by the inner portion 904 of the arrangement of photodiodes 902 to an inner voltage. As such, the inner converter circuit has an input that includes or is coupled to the inner portion 904 of the arrangement of photodiodes 902 and an output. In the depicted example, the inner converter circuit includes a first transistor 914, a second transistor 916, a third transistor 918, and a first current source 920.

As shown, the first transistor 914 has a source coupled to the inner portion 904 of the arrangement of photodiodes 902 and a drain coupled to a voltage supply. The second transistor 916 has a gate coupled to the source of the first transistor 914 and the inner portion 904 of the arrangement of photodiodes 902. In the example, the input of the inner converter circuit is coupled to the source of the first transistor 914 and the gate of the second transistor 916. The source of second transistor 916 is coupled to ground. The third transistor 918 has a drain coupled to a gate of the first transistor 914 and the first current source 920. In the example, the output Vc2 of the inner converter circuit is coupled to the drain of the third transistor 918 and the gate of the first transistor 914. The source of the third transistor 918 is coupled to the drain of the second transistor 916. The gate of the third transistor 918 is coupled to a bias voltage Vb.

In the example, an inner voltage buffer circuit is coupled to the output Vc2 of the inner converter circuit to generate the inner pixel value, which is coupled to the output 954 of the inner pixel cell circuit, in response to the photocurrent generated by the inner portion 904 of the arrangement of photodiodes 902. In the depicted example, the inner voltage buffer circuit includes a fourth transistor 922 and a second current source 924. As shown, the fourth transistor 922 has a gate coupled to the drain of the third transistor 918 and the gate of the first transistor 914. The fourth transistor 922 is configured as a source follower with its source coupled to the second current source 924. The source of the fourth transistor 922 is coupled to the output 954 of the inner pixel cell circuit.

In the depicted example, the outer converter circuit is coupled to convert the photocurrent generated by the outer portion 906 of the arrangement of photodiodes 902 to an outer voltage. As such, the outer converter circuit has an input coupled to the outer portion 906 of the arrangement of photodiodes 902 and an output. In the depicted example, the outer converter circuit includes a fifth transistor 926, a sixth transistor 928, a seventh transistor 930, and a third current source 932.

As shown, the fifth transistor 926 has a source coupled to the outer portion 906 of the arrangement of photodiodes 902 and a drain coupled to a voltage supply. The sixth transistor 928 has a gate coupled to the source of the fifth transistor 926 and the outer portion 906 of the arrangement of photodiodes 902. In the example, the input of the outer converter circuit is coupled to the source of the fifth transistor 926 and the gate of the sixth transistor 928. The source of sixth transistor 928 is coupled to ground. The seventh transistor 930 has a drain coupled to a gate of the fifth transistor 926 and the third current source 932. In the example, the output Vc1 of the outer converter circuit is coupled to the drain of the seventh transistor 930 and the gate of the fifth transistor 926. The source of the seventh transistor 930 is coupled to the drain of the sixth transistor 928. The gate of the seventh transistor 930 is coupled to a bias voltage Vb.

In the example, an outer voltage buffer circuit is coupled to the output Vc1 of the outer converter circuit to generate the outer pixel value, which is coupled to the output 952 of the outer pixel cell circuit, in response to the photocurrent generated by the outer portion 906 of the arrangement of photodiodes 902. In the depicted example, the outer voltage buffer circuit includes an eighth transistor 934 and a fourth current source 936. As shown, the eighth transistor 934 has a gate coupled to the drain of the seventh transistor 930 and the gate of the fifth transistor 926. The eighth transistor 934 is configured as a source follower with its source coupled to the fourth current source 936. The source of the eighth transistor 934 is coupled to the output 952 of the outer pixel cell circuit.

The example depicted in FIG. 9 shows that the event driven circuit 912 includes a comparator 938 having a first input (e.g., inverting input) capacitively coupled to the output 952 of the outer pixel cell circuit 910 through a first input capacitor to receive the outer pixel value. The comparator 938 also includes a second input (e.g., non-inverting input) capacitively coupled the output 954 of the inner pixel cell circuit 908 through a second input capacitor to receive the inner pixel value. A first auto-zero switch S− 946 is coupled between the first input of the comparator 938 and an output of the comparator 938. A second auto-zero switch S+ 948 is coupled between the second input of the comparator 938 and the output of the comparator 938.

In one example, event driven circuit 912 also includes the equalizing switch Seq 950 coupled between the output 952 of the outer pixel cell circuit 910 and the output 954 of the inner pixel cell circuit 908. In various examples, the equalizing switch Seq 950 may be turned on during a reset or auto-zero phase of event driven sensor 900 prior to a comparison phase. In other examples, the equalizing switch Seq 950 may be turned off during both the reset or auto-zero phase as well as during the comparison phase.

In the example, a first threshold detection circuit 940 is coupled to the output of the comparator 938 and a second threshold detection circuit 942 is coupled to the output of the comparator 938. In one example, the output signal of the event driven sensor 900 is responsive to an output OUT+ of the first threshold detection circuit 940 and an output OUT− of the second threshold detection circuit 942.

Figure 10:
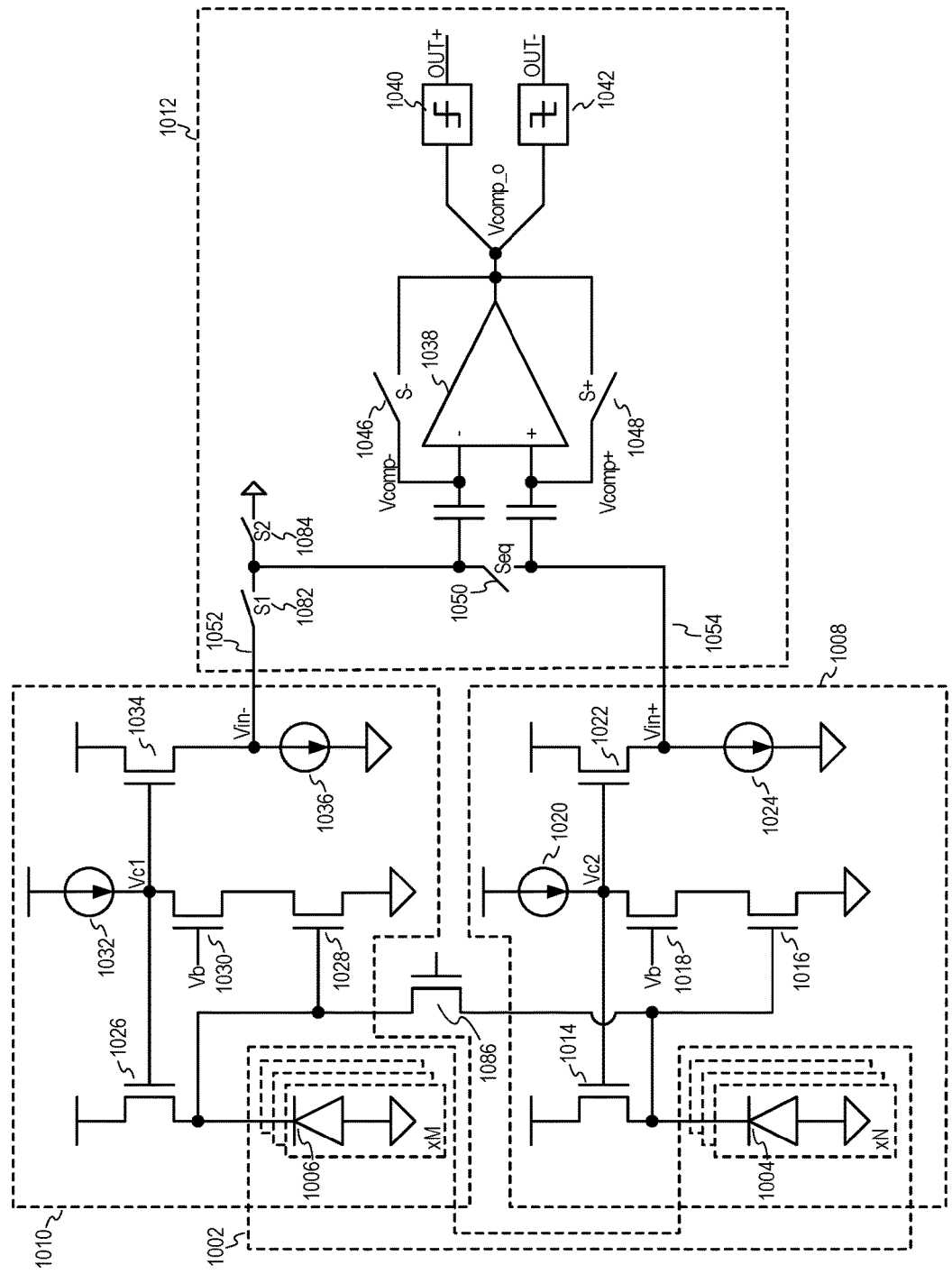
FIG. 10 illustrates still another example of a schematic of an arrangement of photodiodes including an inner portion and an outer portion coupled to the event driven circuit of an event driven sensor in accordance with the teachings of the present invention.

FIG. 10 illustrates still another example of a schematic an event driven sensor 1000 including an arrangement of photodiodes 1002 coupled to an event driven circuit 1012 in accordance with the teachings of the present invention. It is appreciated that the arrangement of photodiodes 1002 included in the event driven sensor 1000 of FIG. 10 may be an example of photodiodes 202 of FIG. 2, and that similarly named and numbered elements described above are coupled and function similarly below. It is also appreciated that event driven sensor 1000 of FIG. 10 shares many similarities with the example event driven sensor 900 of FIG. 9.

For instance, the example event driven sensor 1000 illustrated in FIG. 10 also includes arrangement of photodiodes 1002, which includes an inner portion 1004 laterally surrounded by an outer portion 1006. In one example, the inner portion 1004 includes N photodiodes, which can be one or more photodiodes, and the outer portion 1006 includes a plurality of M photodiodes. In the depicted example, M=12 photodiodes and N=4 photodiodes, such as the example depicted in FIG. 2 above. In other examples, it is appreciated that M and N may have different values. In the example, the arrangement of photodiodes 1002 is optically coupled to receive incident light from a scene.

Similar to the example event driven sensor 800 of FIG. 8 and/or event driven sensor 900 of FIG. 9, event driven sensor 1000 of FIG. 10 also includes a switch S1 1082 coupled between the output Vin− of the outer pixel cell circuit 1010 and the first input capacitor that is coupled to the inverting input of comparator 1038. In addition, event driven sensor 1000 also further includes a switch S2 1084 coupled between the first input capacitor that is coupled to the inverting input of comparator 1038 and ground as shown.

With the switch Si 1082 and switch S2 1084, the event driven sensor 1000 of FIG. 10 can also be reconfigured to be temporally sensitive or spatially sensitive. For instance, in one example, by disabling or turning off the equalizing switch Seq 1050 and the switch Si 1082 while enabling or turning on the switch S2 1084, the comparator 1038 can be configured to capture temporal changes only using the inner portion 1004 in accordance with the teachings of the present invention.

In another example, by enabling or turning on switch Si 1082 and disabling or turning off switch S2 1084, and then by turning on equalizing switch Seq 1050, first auto-zero switch 1046, and second auto-zero switch 1048 during the auto-zero phase, and then turning off equalizing switch Seq 1050, first auto-zero switch 1046, and second auto-zero switch 1048 during the comparison phase, the comparator 1038 can be configured to detect spatial information from the scene using the inner portion 1004 and the outer portion 1006. In still another example, it is appreciated that the equalizing switch 1050 can be turned off during the auto-zero phase as discussed above to capture spatial-temporal information in accordance with the teachings of the present invention.

Similar to event driven sensor 900 of FIG. 9, example event driven sensor 1000 of FIG. 10 is a more compact solution since only one outer pixel cell circuit 1010 is shared among the plurality of M photodiodes included in the outer portion 1006 (e.g., M=12 photodiodes), and only one inner pixel cell circuit 1008 is shared among the plurality of N photodiodes included in the inner portion 1004 (e.g., N=4 photodiodes). In other words, the source follower transistor 1034 is shared among the plurality of M photodiodes included in the outer portion 1006 and the source follower transistor 1022 is shared among the plurality of N photodiodes included in the inner portion 1004.

Thus, the outer pixel cell circuit 1010 includes or is coupled to the plurality of M photodiodes of outer portion 1006 of the arrangement of photodiodes 1002. The outer pixel cell circuit 1010 is coupled to generate an outer pixel value at an output 1052 of the outer pixel cell circuit 1010 in response to photocurrent generated by the outer portion 1006 of the arrangement of photodiodes 1002 in response to the incident light. In the example, the output 1052 is a binned signal representative of an average value of brightness of the incident light from the scene on the outer portion 1006 of the arrangement of photodiodes 1002.

Similarly, the inner pixel cell circuit 1008 includes or is coupled to the plurality of N photodiodes of inner portion 1004 of the arrangement of photodiodes 1002. The inner pixel cell circuit 1008 is coupled to generate an inner pixel value having an inner voltage at the output 1054 of the inner pixel cell circuit 1008 in response to photocurrent generated by from the inner portion 1004 of the arrangement of photodiodes 1002. In the example, the output 1054 is a binned signal representative of an average value of brightness of the incident light from the scene on the inner portion 1004 of the arrangement of photodiodes 1004.

One difference between example event driven sensor 1000 of FIG. 10 and event driven sensor 900 of FIG. 9, is that example event driven sensor 1000 of FIG. 10 also includes a summing switch, which is shown in FIG. 10 as transistor 1086 coupled between the outer portion 1006 of the arrangement of photodiodes and the inner portion 1004 at the input of the inner converter circuit at the gate of transistor 1016 as shown. As such, the outer pixel cell circuit 1010 may be disabled when summing switch or transistor 1086 is turned on so that all of the photodiode currents from the outer portion 1006 as well as the inner portion 1004 may be read out with the gate of transistor 1016 by the inner pixel cell circuit 1008 to read out temporal information from the scene through inner portion 1004 and outer portion 1006. In this configuration, with outer pixel cell circuit 1010 disabled, the switch Si 1082 is also disabled or turned off and the switch S2 1084 is enabled or turned on.

In the illustrated example, an event driven circuit 1012 is coupled to the outer pixel cell circuit 1010 and the inner pixel cell circuit 1008 to receive outer pixel value from output 1052 (when switch Si 1082 is turned on and switch S2 1084 is turned off as discussed above) and the inner pixel value from output 1054. In operation, the event driven circuit 1012 is coupled to generate an output signal responsive to an inner brightness indicated by the inner pixel value from inner pixel cell circuit 1008 relative to an outer brightness indicated by the outer pixel value from outer pixel cell circuit 1010.

In the illustrated example, inner pixel cell circuit 1008 includes an inner converter circuit, which is coupled to convert the photocurrent generated by the inner portion 1004 of the arrangement of photodiodes 1002 to an inner voltage. As such, the inner converter circuit has an input coupled to the inner portion 1004 of the arrangement of photodiodes 1002 and an output. In the depicted example, the inner converter circuit includes a first transistor 1014, a second transistor 1016, a third transistor 1018, and a first current source 1020.

As shown, the first transistor 1014 has a source coupled to the inner portion 1004 of the arrangement of photodiodes 1002 and a drain coupled to a voltage supply. The second transistor 1016 has a gate coupled to the source of the first transistor 1014 and the inner portion 1004 of the arrangement of photodiodes 1002. In the example, the input of the inner converter circuit is coupled to the source of the first transistor 1014 and the gate of the second transistor 1016. The source of second transistor 1016 is coupled to ground. The third transistor 1018 has a drain coupled to a gate of the first transistor 1014 and the first current source 1020. In the example, the output Vc2 of the inner converter circuit is coupled to the drain of the third transistor 1018 and the gate of the first transistor 1014. The source of the third transistor 1018 is coupled to the drain of the second transistor 1016. The gate of the third transistor 1018 is coupled to a bias voltage Vb.

In the example, an inner voltage buffer circuit is coupled to the output Vc2 of the inner converter circuit to generate the inner pixel value, which is coupled to the output 1054 of the inner pixel cell circuit, in response to the photocurrent generated by the inner portion 1004 of the arrangement of photodiodes 1002. In the depicted example, the inner voltage buffer circuit includes a fourth transistor 1022 and a second current source 1024. As shown, the fourth transistor 1022 has a gate coupled to the drain of the third transistor 1018 and the gate of the first transistor 1014. The fourth transistor 1022 is configured as a source follower with its source coupled to the second current source 1024. The source of the fourth transistor 1022 is coupled to the output 1054 of the inner pixel cell circuit.

In the depicted example, the outer converter circuit is coupled to convert the photocurrent generated by the outer portion 1006 of the arrangement of photodiodes 1002 to an outer voltage. As such, the outer converter circuit has an input coupled to the outer portion 1006 of the arrangement of photodiodes 1002 and an output. In the depicted example, the outer converter circuit includes a fifth transistor 1026, a sixth transistor 1028, a seventh transistor 1030, and a third current source 1032.

As shown, the fifth transistor 1026 has a source coupled to the outer portion 1006 of the arrangement of photodiodes 1002 and a drain coupled to a voltage supply. The sixth transistor 1028 has a gate coupled to the source of the fifth transistor 1026 and the outer portion 1006 of the arrangement of photodiodes 1002. In the example, the input of the outer converter circuit is coupled to the source of the fifth transistor 1026 and the gate of the sixth transistor 1028. The source of sixth transistor 1028 is coupled to ground. The seventh transistor 1030 has a drain coupled to a gate of the fifth transistor 1026 and the third current source 1032. In the example, the output Vc1 of the outer converter circuit is coupled to the drain of the seventh transistor 1030 and the gate of the fifth transistor 1026. The source of the seventh transistor 1030 is coupled to the drain of the sixth transistor 1028. The gate of the seventh transistor 1030 is coupled to a bias voltage Vb.

In the example, an outer voltage buffer circuit is coupled to the output Vc1 of the outer converter circuit to generate the outer pixel value, which is coupled to the output 1052 of the outer pixel cell circuit, in response to the photocurrent generated by the outer portion 1006 of the arrangement of photodiodes 1002. In the depicted example, the outer voltage buffer circuit includes an eighth transistor 1034 and a fourth current source 1036. As shown, the eighth transistor 1034 has a gate coupled to the drain of the seventh transistor 1030 and the gate of the fifth transistor 1026. The eighth transistor 1034 is configured as a source follower with its source coupled to the fourth current source 1036. The source of the eighth transistor 1034 is coupled to the output 1052 of the outer pixel cell circuit.

The example depicted in FIG. 10 shows that the event driven circuit 1012 also includes a comparator 1038 having a first input (e.g., inverting input) capacitively coupled to the output 1052 of the outer pixel cell circuit 1010 through a first input capacitor to receive the outer pixel value. The comparator 1038 also includes a second input (e.g., non-inverting input) capacitively coupled the output 1054 of the inner pixel cell circuit 1008 through a second input capacitor to receive the inner pixel value. A first auto-zero switch S− 1046 is coupled between the first input of the comparator 1038 and an output of the comparator 1038. A second auto-zero switch S+ 1048 is coupled between the second input of the comparator 1038 and the output of the comparator 1038.

In one example, event driven circuit 1012 also includes the equalizing switch Seq 1050 coupled between the output 1052 of the outer pixel cell circuit 1010 and the output 1054 of the inner pixel cell circuit 1008. In various examples, the equalizing switch Seq 1050 may be turned on during a reset or auto-zero phase of event driven sensor 1000 prior to a comparison phase. In other examples, the equalizing switch Seq 1050 may be turned off during both the reset or auto-zero phase as well as during the comparison phase.

In the example, a first threshold detection circuit 1040 is coupled to the output of the comparator 1038 and a second threshold detection circuit 1042 is coupled to the output of the comparator 1038. In one example, the output signal of the event driven sensor 1000 is responsive to an output OUT+ of the first threshold detection circuit 1040 and an output OUT− of the second threshold detection circuit 1042.

Figure 11:
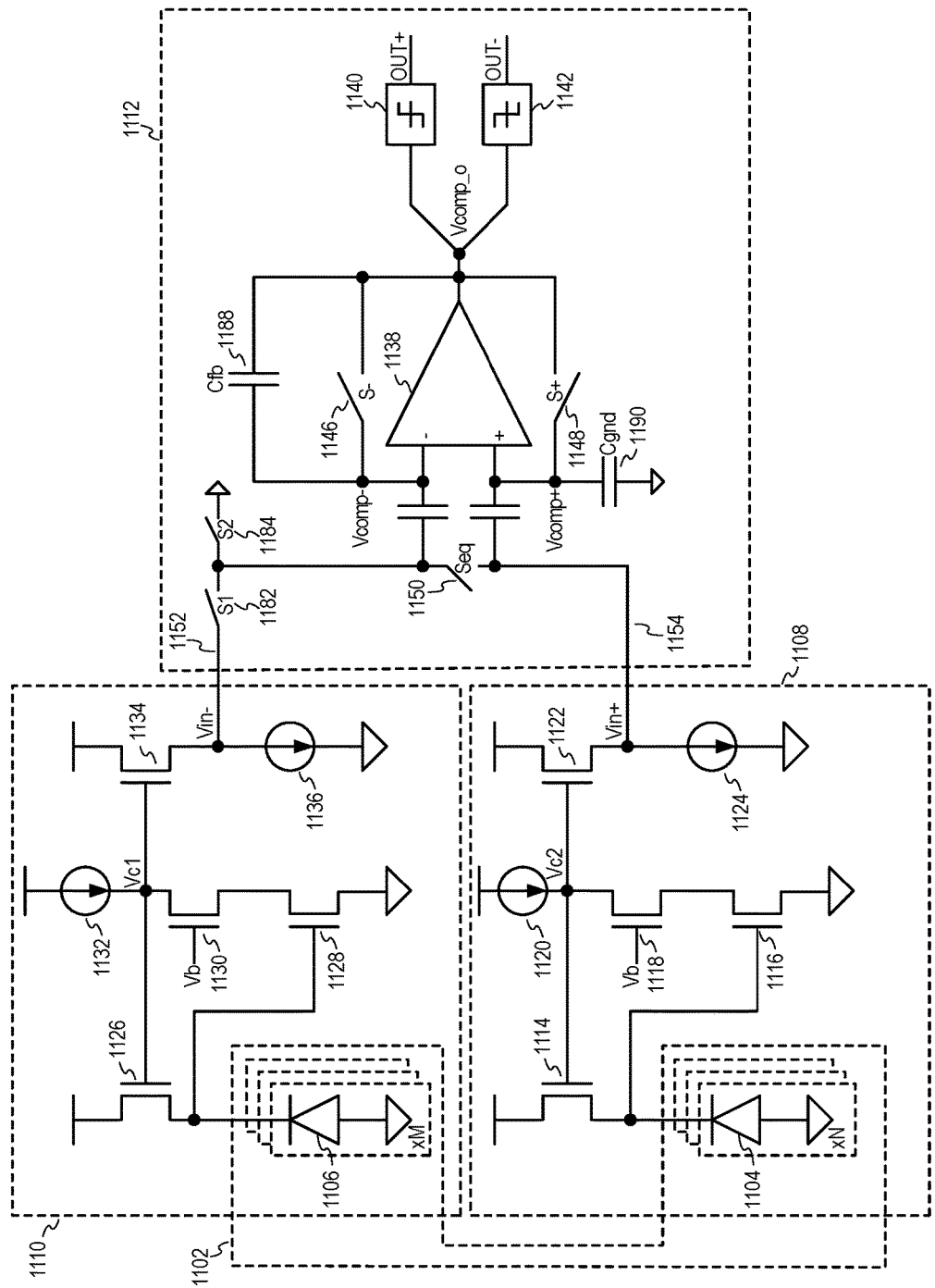
FIG. 11 illustrates yet another example of a schematic of an arrangement of photodiodes including an inner portion and an outer portion coupled to the event driven circuit of an event driven sensor in accordance with the teachings of the present invention.

FIG. 11 illustrates yet another example of a schematic an event driven sensor 1100 including an arrangement of photodiodes 1102 coupled to an event driven circuit 1112 in accordance with the teachings of the present invention. It is appreciated that the arrangement of photodiodes 1102 included in the event driven sensor 1100 of FIG. 11 may be an example of photodiodes 202 of FIG. 2, and that similarly named and numbered elements described above are coupled and function similarly below. It is also appreciated that event driven sensor 1100 of FIG. 11 also shares many similarities with the example event driven sensor 900 of FIG. 9.

For instance, the example event driven sensor 1100 illustrated in FIG. 11 also includes arrangement of photodiodes 1102, which includes an inner portion 1104 laterally surrounded by an outer portion 1106. In one example, the inner portion 1104 includes N photodiodes, which can be one or more photodiodes, and the outer portion 1106 includes a plurality of M photodiodes. In the depicted example, M=12 photodiodes and N=4 photodiodes, such as the example depicted in FIG. 2 above. In other examples, it is appreciated that M and N may have different values. In the example, the arrangement of photodiodes 1102 is optically coupled to receive incident light from a scene.

Similar to the example event driven sensor 900 of FIG. 9, event driven sensor 1100 of FIG. 11 also includes a switch S1 1182 coupled between the output Vin− of the outer pixel cell circuit 1110 and the first input capacitor that is coupled to the inverting input of comparator 1138. In addition, event driven sensor 1100 also further includes a switch S2 1184 coupled between the first input capacitor that is coupled to the inverting input of comparator 1138 and ground as shown.

With the switch S1 1182 and switch S2 1184, the event driven sensor 1100 of FIG. 11 can also be reconfigured to be temporally sensitive or spatially sensitive. For instance, in one example, by disabling or turning off the equalizing switch Seq 1150 and the switch S1 1182 while enabling or turning on the switch S2 1184, the comparator 1138 can be configured to capture temporal changes only using the inner portion 1104 in accordance with the teachings of the present invention.

In another example, by enabling or turning on switch S1 1182 and disabling or turning off switch S2 1184, and then by turning on equalizing switch Seq 1150, first auto-zero switch 1146, and second auto-zero switch 1148 during the auto-zero phase, and then turning off equalizing switch Seq 1150, first auto-zero switch 1146, and second auto-zero switch 1148 during the comparison phase, the comparator 1138 can be configured to detect spatial information from the scene using the inner portion 1104 and the outer portion 1106. In still another example, it is appreciated that the equalizing switch 1150 can be turned off during the auto-zero phase as discussed above to capture spatial-temporal information in accordance with the teachings of the present invention.

Similarly to event driven sensor 900 of FIG. 9, example event driven sensor 1100 of FIG. 11 is a more compact solution since one outer pixel cell circuit 1110 is shared among the plurality of M photodiodes included in the outer portion 1106 (e.g., M=12 photodiodes), and one inner pixel cell circuit 1108 is shared among the plurality of N photodiodes included in the inner portion 1104 (e.g., N=4 photodiodes). In other words, the source follower transistor 1134 is shared among the plurality of M photodiodes included in the outer portion 1106 and the source follower transistor 1122 is shared among the plurality of N photodiodes included in the inner portion 1104.

Thus, the outer pixel cell circuit 1110 includes or is coupled to the plurality of M photodiodes of outer portion 1106 of the arrangement of photodiodes 1102. The outer pixel cell circuit 1110 is coupled to generate an outer pixel value at an output 1152 of the outer pixel cell circuit 1110 in response to photocurrent generated by the outer portion 1106 of the arrangement of photodiodes 1102 in response to the incident light. In the example, the output 1152 is a binned signal representative of an average value of brightness of the incident light from the scene on the outer portion 1106 of the arrangement of photodiodes 1102.

Similarly, the inner pixel cell circuit 1108 includes or is coupled to the plurality of N photodiodes of inner portion 1104 of the arrangement of photodiodes 1102. The inner pixel cell circuit 1108 is coupled to generate an inner pixel value having an inner voltage at the output 1154 of the inner pixel cell circuit 1108 in response to photocurrent generated by from the inner portion 1104 of the arrangement of photodiodes 1102. In the example, the output 1154 is a binned signal representative of an average value of brightness of the incident light from the scene on the inner portion 1104 of the arrangement of photodiodes 1004.

In the illustrated example, an event driven circuit 1112 is coupled to the outer pixel cell circuit 1110 and the inner pixel cell circuit 1108 to receive outer pixel value from output 1152 (when switch Si 1182 is turned on and switch S2 1184 is turned off as discussed above) and the inner pixel value from output 1154. In operation, the event driven circuit 1112 is coupled to generate an output signal responsive to an inner brightness indicated by the inner pixel value from inner pixel cell circuit 1108 relative to an outer brightness indicated by the outer pixel value from outer pixel cell circuit 1110.

In the illustrated example, inner pixel cell circuit 1108 includes an inner converter circuit, which is coupled to convert the photocurrent generated by the inner portion 1104 of the arrangement of photodiodes 1102 to an inner voltage. As such, the inner converter circuit has an input coupled to the inner portion 1104 of the arrangement of photodiodes 1102 and an output. In the depicted example, the inner converter circuit includes a first transistor 1114, a second transistor 1116, a third transistor 1118, and a first current source 1120.

As shown, the first transistor 1114 has a source coupled to the inner portion 1104 of the arrangement of photodiodes 1102 and a drain coupled to a voltage supply. The second transistor 1116 has a gate coupled to the source of the first transistor 1114 and the inner portion 1104 of the arrangement of photodiodes 1102. In the example, the input of the inner converter circuit is coupled to the source of the first transistor 1114 and the gate of the second transistor 1116. The source of second transistor 1116 is coupled to ground. The third transistor 1118 has a drain coupled to a gate of the first transistor 1114 and the first current source 1120. In the example, the output Vc2 of the inner converter circuit is coupled to the drain of the third transistor 1118 and the gate of the first transistor 1114. The source of the third transistor 1118 is coupled to the drain of the second transistor 1116. The gate of the third transistor 1118 is coupled to a bias voltage Vb.

In the example, an inner voltage buffer circuit is coupled to the output Vc2 of the inner converter circuit to generate the inner pixel value, which is coupled to the output 1154 of the inner pixel cell circuit, in response to the photocurrent generated by the inner portion 1104 of the arrangement of photodiodes 1102. In the depicted example, the inner voltage buffer circuit includes a fourth transistor 1122 and a second current source 1124. As shown, the fourth transistor 1122 has a gate coupled to the drain of the third transistor 1118 and the gate of the first transistor 1114. The fourth transistor 1122 is configured as a source follower with its source coupled to the second current source 1124. The source of the fourth transistor 1122 is coupled to the output 1154 of the inner pixel cell circuit.

In the depicted example, the outer converter circuit is coupled to convert the photocurrent generated by the outer portion 1106 of the arrangement of photodiodes 1102 to an outer voltage. As such, the outer converter circuit has an input coupled to the outer portion 1106 of the arrangement of photodiodes 1102 and an output. In the depicted example, the outer converter circuit includes a fifth transistor 1126, a sixth transistor 1128, a seventh transistor 1130, and a third current source 1132.

As shown, the fifth transistor 1126 has a source coupled to the outer portion 1106 of the arrangement of photodiodes 1102 and a drain coupled to a voltage supply. The sixth transistor 1128 has a gate coupled to the source of the fifth transistor 1126 and the outer portion 1106 of the arrangement of photodiodes 1102. In the example, the input of the outer converter circuit is coupled to the source of the fifth transistor 1126 and the gate of the sixth transistor 1128. The source of sixth transistor 1128 is coupled to ground. The seventh transistor 1130 has a drain coupled to a gate of the fifth transistor 1126 and the third current source 1132. In the example, the output Vc1 of the outer converter circuit is coupled to the drain of the seventh transistor 1130 and the gate of the fifth transistor 1126. The source of the seventh transistor 1130 is coupled to the drain of the sixth transistor 1128. The gate of the seventh transistor 1130 is coupled to a bias voltage Vb.

In the example, an outer voltage buffer circuit is coupled to the output Vc1 of the outer converter circuit to generate the outer pixel value, which is coupled to the output 1152 of the outer pixel cell circuit, in response to the photocurrent generated by the outer portion 1106 of the arrangement of photodiodes 1102. In the depicted example, the outer voltage buffer circuit includes an eighth transistor 1134 and a fourth current source 1136. As shown, the eighth transistor 1134 has a gate coupled to the drain of the seventh transistor 1130 and the gate of the fifth transistor 1126. The eighth transistor 1134 is configured as a source follower with its source coupled to the fourth current source 1136. The source of the eighth transistor 1134 is coupled to the output 1152 of the outer pixel cell circuit.

The example depicted in FIG. 11 shows that the event driven circuit 1112 also includes a comparator 1138 having a first input (e.g., inverting input) capacitively coupled to the output 1152 of the outer pixel cell circuit 1110 through a first input capacitor to receive the outer pixel value. The comparator 1138 also includes a second input (e.g., non-inverting input) capacitively coupled the output 1154 of the inner pixel cell circuit 1108 through a second input capacitor to receive the inner pixel value. A first auto-zero switch S– 1146 is coupled between the first input of the comparator 1138 and an output of the comparator 1138. A second auto-zero switch S+ 1148 is coupled between the second input of the comparator 1138 and the output of the comparator 1138.

One difference between example event driven sensor 1100 of FIG. 11 and event driven sensor 900 of FIG. 9, is that example event driven sensor 1100 of FIG. 11 is illustrated with a closed-loop configuration rather than open-loop configuration. In particular, the example depicted in FIG. 11 shows that a feedback capacitor Cfb 1188 is also included and is coupled between the inverting input of comparator 1138 and the output of comparator 1138. In addition, a ground capacitor Cgnd 1190 is also included and is coupled between the non-inverting input of comparator 1138 and ground.

In one example, event driven circuit 1112 also includes the equalizing switch Seq 1150 coupled between the output 1152 of the outer pixel cell circuit 1110 and the output 1154 of the inner pixel cell circuit 1108. In various examples, the equalizing switch Seq 1150 may be turned on during a reset or auto-zero phase of event driven sensor 1100 prior to a comparison phase. In other examples, the equalizing switch Seq 1150 may be turned off during both the reset or auto-zero phase as well as during the comparison phase.

In the example, a first threshold detection circuit 1140 is coupled to the output of the comparator 1138 and a second threshold detection circuit 1142 is coupled to the output of the comparator 1138. In one example, the output signal of the event driven sensor 1100 is responsive to an output OUT+ of the first threshold detection circuit 1140 and an output OUT– of the second threshold detection circuit 1142.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An event driven sensor, comprising:
an arrangement of photodiodes including an inner portion laterally surrounded by an outer portion, wherein the arrangement of photodiodes is optically coupled to receive incident light from a scene;
an outer pixel cell circuit coupled to the outer portion of the arrangement of photodiodes, wherein the outer pixel cell circuit is coupled to generate an outer pixel value at an output of the outer pixel cell circuit in response to photocurrent generated by the outer portion of the arrangement of photodiodes, wherein the outer pixel value is a binned signal representative of an average value of brightness of the incident light from the scene on the outer portion of the arrangement of photodiodes;
an inner pixel cell circuit coupled to the inner portion of the arrangement of photodiodes, wherein the inner pixel cell circuit is coupled to generate an inner pixel value at an output of the inner pixel cell circuit in response to photocurrent generated by from the inner portion of the arrangement of photodiodes; and
an event driven circuit coupled to the outer pixel cell circuit and the inner pixel cell circuit, wherein the event driven circuit is coupled to generate an output signal responsive to an inner brightness indicated by the inner pixel value relative to an outer brightness indicated by the outer pixel value.

2. The event driven sensor of claim 1,
wherein the inner portion of the arrangement of photodiodes includes at least one photodiode, and
wherein the outer portion of the arrangement of photodiodes includes a plurality of outer photodiodes that laterally surround the inner portion of the arrangement of photodiodes.

3. The event driven sensor of claim 2, wherein the inner pixel cell circuit comprises:
an inner converter circuit having an input coupled to the inner portion of the arrangement of photodiodes to convert the photocurrent generated by the inner portion of the arrangement of photodiodes to an inner voltage; and an inner voltage buffer circuit coupled to an output of the inner converter circuit to generate the inner pixel value coupled to the output of the inner pixel cell circuit in response to the photocurrent generated by the inner portion of the arrangement of photodiodes.

4. The event driven sensor of claim 3, wherein the inner converter circuit comprises:
a first transistor, having:
a source coupled to the inner portion of the arrangement of photodiodes, and
a drain coupled to a voltage supply;
a second transistor, having:
a gate coupled to the source of the first transistor and the inner portion of the arrangement of photodiodes, wherein the input of the inner converter circuit is coupled to the source of the first transistor and the gate of the second transistor; and
a source coupled to ground; and
a third transistor, having:
a drain coupled to a gate of the first transistor and a first current source; and
a source coupled to a drain of the second transistor.

5. The event driven sensor of claim 4, wherein the inner voltage buffer circuit comprises a fourth transistor, having:
a gate coupled to the drain of the third transistor and the gate of the first transistor; and
a source coupled to a second current source, wherein the source of the fourth transistor is coupled to the output of the inner pixel cell circuit.

6. The event driven sensor of claim 3, wherein the inner portion of the arrangement of photodiodes includes a plurality of photodiodes, wherein the input of the inner converter circuit of the inner pixel cell circuit is coupled to each one of the plurality of photodiodes of the inner portion of the arrangement of photodiodes.

7. The event driven sensor of claim 3, wherein the outer pixel cell circuit comprises:
an outer converter circuit having an input coupled to the outer portion of the arrangement of photodiodes to convert the photocurrent generated by the outer portion of the arrangement of photodiodes to an outer voltage; and
an outer voltage buffer coupled to an output of the outer converter circuit to generate the outer pixel value coupled to the output of the outer pixel cell circuit in response to the photocurrent generated by the outer portion of the arrangement of photodiodes.

8. The event driven sensor of claim 7, wherein the outer converter circuit comprises:
a fifth transistor, having:
a source coupled to the outer portion of the arrangement of photodiodes, and
a drain coupled to a voltage supply;
a sixth transistor, having:
a gate coupled to the source of the fifth transistor and the outer portion of the arrangement of photodiodes, wherein the input of the outer converter circuit is coupled to the source of the fifth transistor and the gate of the sixth transistor; and
a source coupled to ground; and
a seventh transistor, having:
a drain coupled to a gate of the fifth transistor and a third current source; and
a source coupled to a drain of the sixth transistor.

9. The event driven sensor of claim 8, wherein the outer voltage buffer circuit comprises an eighth transistor, having:
a gate coupled to the drain of the seventh transistor and the gate of the fifth transistor; and
a source coupled to a fourth current source, wherein the source of the eighth transistor is coupled to the output of the outer pixel cell circuit.

10. The event driven sensor of claim 9, wherein the outer pixel cell circuit is one of a plurality of outer pixel cell circuits, wherein the input of each one of the plurality of outer converter circuits of each outer pixel cell circuit is coupled to a respective one of the plurality of photodiodes of the outer portion of the arrangement of photodiodes, wherein the outputs of the plurality of outer pixel cell circuits are coupled to each other.

11. The event driven sensor of claim 9, wherein the input of the outer converter circuit is coupled to each one of the plurality of outer photodiodes of the outer portion of the arrangement of photodiodes.

12. The event driven sensor of claim 7, wherein the event driven circuit comprises:
a comparator, having:
a first input capacitively coupled to the output of the outer pixel cell circuit through a first input capacitor to receive the outer pixel value, and
a second input capacitively coupled the output of the inner pixel cell circuit through a second input capacitor to receive the inner pixel value;
a first auto-zero switch coupled between the first input of the comparator and an output of the comparator;
a second auto-zero switch coupled between the second input of the comparator and the output of the comparator;
an equalizing switch coupled between the output of the outer pixel cell circuit and the output of the inner pixel cell circuit;
a first threshold detection circuit coupled to the output of the comparator; and
a second threshold detection circuit coupled to the output of the comparator,
wherein the output signal of the event driven sensor is responsive to an output of the first threshold detection circuit and an output of the second threshold detection circuit.

13. The event driven sensor of claim 12, wherein the comparator comprises:
a ninth transistor having a drain coupled to a voltage supply;
a tenth transistor, having:
a drain coupled to the voltage supply, and
a gate coupled to a gate of the ninth transistor and a source of the ninth transistor;
an eleventh transistor having a drain coupled to the source of the ninth transistor, wherein the first input of the comparator is coupled to a gate of the eleventh transistor;
a twelfth transistor having a drain coupled to a source of the tenth transistor, wherein the second input of the comparator is coupled to a gate of the twelfth transistor, wherein the output of the comparator is coupled to the drain of the twelfth transistor; and
a first tunable current source coupled to a source of the eleventh transistor and a source of the twelfth transistor.

14. The event driven sensor of claim 12, wherein the first threshold detection circuit comprises:
a thirteenth transistor, having:

a drain coupled to the voltage supply, and
a gate coupled to the output of the comparator,
a source coupled to the output of the first threshold detection circuit; and
a second tunable current source coupled to the source of the thirteenth transistor.

15. The event driven sensor of claim 12, wherein the second threshold detection circuit comprises:
a fourteenth transistor, having:
a drain coupled to the voltage supply, and
a gate coupled to the output of the comparator,
a source coupled to the output of the second threshold detection circuit; and
a third tunable current source coupled to the source of the fourteenth transistor.

16. The event driven sensor of claim 12,
wherein the output signal of the event driven sensor is in a first state in response to the outputs of the first and second threshold detection circuits indicating that the outer pixel value is greater than the inner pixel value,
wherein the output signal of the event driven sensor is in a second state in response to the outputs of the first and second threshold detection circuits indicating that the outer pixel value is less than the inner pixel value, and
wherein the outputs of the output signal of the event driven sensor is in a third state in response to the first and second threshold detection circuits indicating that the outer pixel value the inner pixel value are substantially equal.

17. The event driven sensor of claim 12,
wherein the first auto-zero switch, the second auto-zero switch, and the equalizing switch are turned on simultaneously to reset the event driven sensor, and
wherein the first auto-zero switch, the second auto-zero switch, and the equalizing switch are turned off simultaneously to generate the output signal responsive to the inner brightness indicated by the inner pixel value relative to the outer brightness indicated by the outer pixel value, wherein the output signal is configured to provide static, spatial, and temporal event information from the scene.

18. The event driven sensor of claim 12,
wherein the equalizing switch is turned off,
wherein the first auto-zero switch and the second auto-zero switch are turned on simultaneously to reset the event driven sensor, and
wherein the first auto-zero switch and the second auto-zero switch are turned off simultaneously to generate the output signal responsive to the inner brightness indicated by the inner pixel value relative to the outer brightness indicated by the outer pixel value, wherein the output signal is configured to provide temporal event information from the scene.

19. The event driven sensor of claim 12, wherein the event driven circuit further comprises:
an outer input enable switch coupled between the output of the outer pixel cell circuit and the first input capacitor; and
an outer ground enable switch coupled between the first input capacitor and ground.

20. The event driven sensor of claim 19,
wherein the equalizing switch and the outer input enable switch are turned off, and wherein the outer ground enable switch is turned on,
wherein the first auto-zero switch and the second auto-zero switch are turned on simultaneously to reset the event driven sensor, and
wherein the first auto-zero switch and the second auto-zero switch are turned off simultaneously to generate the output signal responsive to the inner brightness indicated by the inner pixel value, wherein the output signal is configured to provide temporal event information from the scene.

21. The event driven sensor of claim 19,
wherein the outer ground enable switch and the equalizing switch are turned off and the outer input enable switch is turned on,
wherein the first auto-zero switch and the second auto-zero switch are turned on simultaneously to reset the event driven sensor, and
wherein the first auto-zero switch and the second auto-zero switch are turned off simultaneously to generate the output signal responsive to the inner brightness indicated by the inner pixel value and the outer brightness indicated by the outer pixel value.

22. The event driven sensor of claim 12, further comprising a summing switch coupled between the outer portion of the arrangement of photodiodes and the input of the inner converter circuit.

23. The event driven sensor of claim 22,
wherein the equalizing switch and the outer input enable switch are turned off, and wherein the summing switch and the outer ground enable switch are turned on,
wherein the first auto-zero switch and the second auto-zero switch are turned on simultaneously to reset the event driven sensor, and
wherein the first auto-zero switch and the second auto-zero switch are turned off simultaneously to generate the output signal responsive to the inner portion of the arrangement of photodiodes and the outer portion of the arrangement of photodiodes represented by the inner brightness indicated by the inner pixel value.

24. The event driven sensor of claim 12, wherein the event driven circuit further comprises:
a feedback capacitor coupled between the first input of the comparator and the output of the comparator; and
a ground capacitor coupled between the second input of the comparator and ground.

25. A method for sensing an event, comprising:
receiving incident light from a scene onto an arrangement of photodiodes, wherein the arrangement of photodiodes includes an inner portion laterally surrounded by an outer portion;
generating an outer pixel value at an output of an outer pixel cell circuit in response to photocurrent generated by the outer portion of the arrangement of photodiodes, wherein the outer pixel value is a binned signal representative of an average value of brightness of the incident light from the scene on the outer portion of the arrangement of photodiodes;
generating an inner pixel value at an output of an inner pixel cell circuit in response to photocurrent generated by from the inner portion of the arrangement of photodiodes;
comparing the outer pixel value received from the output of an outer pixel cell circuit with the inner pixel value received from the output of the inner pixel cell circuit;
generating an output signal at an output of an event driven circuit in response to a comparison of the inner pixel value relative to the outer pixel value.

26. The method of claim 25,
wherein the inner portion of the arrangement of photodiodes includes at least one photodiode, and wherein the outer portion of the arrangement of photodiodes includes a plurality of outer photodiodes that laterally surround the inner portion of the arrangement of photodiodes.

27. The method of claim 26, wherein generating the inner pixel value at the output of the inner pixel cell circuit comprises:
   converting the photocurrent generated by the inner portion of the arrangement of photodiodes to an inner voltage with an inner converter circuit; and
   buffering the inner voltage generated by the inner converter circuit with an inner voltage buffer circuit to generate the inner pixel value.

28. The method of claim 27, wherein generating the outer pixel value at the output of the outer pixel cell circuit comprises:
   converting the photocurrent generated by the outer portion of the arrangement of photodiodes to an outer voltage with an outer converter circuit; and
   buffering the outer voltage generated by the outer converter circuit with an outer voltage buffer circuit to generate the outer pixel value.

29. The method of claim 28, wherein comparing the outer pixel value received from the output of the outer pixel cell circuit with the inner pixel value received from the output of the inner pixel cell circuit comprises:
   receiving the outer pixel value at a first input of a comparator;
   receiving the inner pixel value at a second input of the comparator; and
   generating the comparison of the inner brightness indicated by the inner pixel value relative to the outer pixel value.

30. The method of claim 29, wherein generating the output signal at the output of the event driven circuit in response to the comparison of the inner pixel value relative to the outer pixel value comprises:
   receiving the comparison of the inner brightness indicated by the inner pixel value relative to the outer pixel value with a first threshold detection circuit;
   receiving the comparison of the inner brightness indicated by the inner pixel value relative to the outer pixel value with a second threshold detection circuit; and
   generating the output signal in response to an output of the first threshold detection circuit and an output of the second threshold detection circuit.

31. The method of claim 30,
   wherein the output signal of the event driven sensor is in a first state in response to the outputs of the first and second threshold detection circuits indicating that the outer pixel value is greater than the inner pixel value,
   wherein the output signal of the event driven sensor is in a second state in response to the outputs of the first and second threshold detection circuits indicating that the outer pixel value is less than the inner pixel value, and
   wherein the outputs of the output signal of the event driven sensor is in a third state in response to the first and second threshold detection circuits indicating that the outer pixel value the inner pixel value are substantially equal.

32. The method of claim 31, further comprising resetting the comparator, wherein resetting the comparator comprises:
   turning on an equalizing switch coupled between the output of the outer pixel cell circuit and the output of the inner pixel cell circuit;
   turning on a first auto-zero switch coupled between the first input of the comparator and an output of the comparator;
   turning on a second auto-zero switch coupled between the second input of the comparator and the output of the comparator.

33. The method of claim 32, wherein generating the comparison of the inner pixel value relative to the outer pixel value comprises turning off the first auto-zero switch, the second auto-zero switch, and the equalizing switch simultaneously after resetting the comparator, wherein the output signal at the output of the event driven circuit is configured to provide static, spatial, and temporal event information from the scene.

34. The method of claim 31, further comprising resetting the comparator, wherein resetting the comparator comprises:
   turning off an equalizing switch coupled between the output of the outer pixel cell circuit and the output of the inner pixel cell circuit;
   turning on a first auto-zero switch coupled between the first input of the comparator and an output of the comparator;
   turning on a second auto-zero switch coupled between the second input of the comparator and the output of the comparator.

35. The method of claim 34, wherein generating the comparison of the inner pixel value relative to the outer pixel value comprises turning off the first auto-zero switch and the second auto-zero switch after resetting the comparator, wherein the output signal at the output of the event driven circuit is configured to provide spatial and temporal event information from the scene.

36. The method of claim 31, further comprising resetting the comparator, wherein resetting the comparator comprises:
   turning off an equalizing switch coupled between the output of the outer pixel cell circuit and the output of the inner pixel cell circuit;
   turning off an outer input enable switch coupled between the output of the outer pixel cell circuit and the first input capacitor;
   turning on an outer ground enable switch coupled between the first input of the comparator and ground to substitute ground for the outer pixel value;
   turning on a first auto-zero switch coupled between the first input of the comparator and an output of the comparator;
   turning on a second auto-zero switch coupled between the second input of the comparator and the output of the comparator.

37. The method of claim 36, wherein generating the comparison of the inner pixel value relative to the outer pixel value comprises turning off the first auto-zero switch and the second auto-zero switch after resetting the comparator, wherein the output signal at the output of the event driven circuit is configured to provide temporal event information from the scene.

38. The method of claim 31, further comprising resetting the comparator, wherein resetting the comparator comprises:
   turning on a summing switch coupled between the outer portion of the arrangement of photodiodes and the input of the inner converter circuit;
   turning off an equalizing switch coupled between the output of the outer pixel cell circuit and the output of the inner pixel cell circuit;
   turning off an outer input enable switch coupled between the output of the outer pixel cell circuit and the first input capacitor;

turning on an outer ground enable switch coupled between the first input of the comparator and ground to substitute ground for the outer pixel value;

turning on a first auto-zero switch coupled between the first input of the comparator and an output of the comparator;

turning on a second auto-zero switch coupled between the second input of the comparator and the output of the comparator.

39. The method of claim 38, wherein generating the comparison of the inner pixel value relative to the outer pixel value comprises turning off the first auto-zero switch and the second auto-zero switch after resetting the comparator, wherein the output signal at the output of the event driven circuit is configured to provide temporal event information from the scene.

* * * * *